(12) United States Patent
Kim et al.

(10) Patent No.: US 10,068,904 B2
(45) Date of Patent: Sep. 4, 2018

(54) SEMICONDUCTOR DEVICE

(71) Applicant: SAMSUNG ELECTRONICS CO., LTD., Suwon-si, Gyeonggi-Do (KR)

(72) Inventors: Ju Youn Kim, Suwon-si (KR); Gi Gwan Park, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/422,897

(22) Filed: Feb. 2, 2017

(65) Prior Publication Data

US 2017/0229462 A1 Aug. 10, 2017

(30) Foreign Application Priority Data

Feb. 5, 2016 (KR) .................. 10-2016-0014713
Jun. 13, 2016 (KR) .................. 10-2016-0072910

(51) Int. Cl.
*H01L 27/092* (2006.01)
*H01L 21/8238* (2006.01)

(52) U.S. Cl.
CPC .. *H01L 27/0922* (2013.01); *H01L 21/823857* (2013.01)

(58) Field of Classification Search
CPC ............... H01L 27/0922; H01L 21/823857
See application file for complete search history.

(56) References Cited

U.S. PATENT DOCUMENTS

| | | | |
|---|---|---|---|
| 6,586,305 B2 | 7/2003 | Graf | |
| 7,465,624 B2 | 12/2008 | Nakajima et al. | |
| 7,723,392 B2 | 6/2010 | Yang et al. | |
| 7,732,872 B2 | 6/2010 | Cheng et al. | |
| 8,168,493 B2* | 5/2012 | Kim | H01L 21/28 257/E21.158 |
| 8,313,993 B2 | 11/2012 | Cho et al. | |
| 8,524,554 B2 | 9/2013 | Cho et al. | |
| 8,790,973 B2 | 7/2014 | Scheiper et al. | |
| 8,841,731 B2 | 9/2014 | Chen et al. | |

(Continued)

FOREIGN PATENT DOCUMENTS

| | | |
|---|---|---|
| CN | 104241142 | 12/2014 |
| CN | 104299986 | 1/2015 |

(Continued)

*Primary Examiner* — David Vu

(74) *Attorney, Agent, or Firm* — F. Chau & Associates, LLC

(57) ABSTRACT

A semiconductor device includes first and second active regions and a field insulating film contacting between the first and second active regions, and a gate electrode structure traversing the first and second active regions and the field insulating film, wherein the gate electrode structure includes a first portion positioned across the first active region and the field insulating film, a second portion positioned across the second active region and the field insulating film, and a third portion contacting the first and second portions. The gate electrode structure includes a gate electrode having an insertion film traversing the first and second active regions and the field insulating film second active region, and a filling film on the insertion film. A thickness of the gate electrode in the third portion is different from a thickness of the gate electrode in the first portion and the second portion.

13 Claims, 29 Drawing Sheets

(56) References Cited

U.S. PATENT DOCUMENTS

| | | |
|---|---|---|
| 9,048,219 B2 | 6/2015 | Kim et al. |
| 9,209,184 B2 | 12/2015 | Kim et al. |
| 9,240,411 B1 | 1/2016 | Kim et al. |
| 2012/0256270 A1 | 10/2012 | Lee et al. |
| 2014/0370699 A1 | 12/2014 | Kim et al. |
| 2016/0093620 A1 | 3/2016 | Kim et al. |
| 2016/0111428 A1 | 4/2016 | Kim et al. |
| 2016/0126351 A1 | 5/2016 | Kim et al. |
| 2016/0163706 A1 | 6/2016 | Kim et al. |

FOREIGN PATENT DOCUMENTS

| | | |
|---|---|---|
| EP | 2083441 | 7/2009 |
| JP | 2010-021200 | 1/2010 |
| JP | 2010-153489 | 7/2010 |
| KR | 10-2008-0103277 | 11/2000 |
| KR | 10-2009-0081346 | 7/2009 |
| TW | 201503371 | 1/2015 |

\* cited by examiner

SEMICONDUCTOR DEVICE

CROSS-REFERENCE TO RELATED APPLICATION

This application claims priority under 35 U.S.C. 119 to Korean Patent Application No. 10-2016-0014713 filed on Feb. 5, 2016 and Korean Patent Application No. 10-2016-0072910 filed on Jun. 13, 2016 in the Korean Intellectual Property Office, the disclosure of each is incorporated by reference in their entireties herein.

BACKGROUND

1. Technical Field

The present disclosure relates to a semiconductor device.

2. Discussion of Related Art

The recent dramatic increase in the distribution of information media has led to remarkable advancements in the functions performed by semiconductor devices. To ensure higher competitiveness, new semiconductor products are required to meet demands for lower cost and higher quality by way of higher integration.

A semiconductor device is equipped with discrete devices such as metal oxide semiconductor MOS transistors. Due to continuous integration of the semiconductor device, gates of the MOS transistors are gradually becoming smaller, and underlying channel regions of the gates are also gradually becoming narrower.

However, when a width of a gate region of a MOS transistor becomes narrower as the semiconductor device becomes highly-integrated, a pitch between a source region and a drain region may also become narrower.

SUMMARY

At least one embodiment of the inventive concept provides a semiconductor device with an enhanced threshold voltage using a plurality of metal patterning processes.

According to an exemplary embodiment of the present inventive concept, there is provided a semiconductor device including a substrate including a first active region, a second active region, and a field insulating film directly contacting the first active region and the second active region between the first active region and the second active region; and a gate electrode structure traversing the first active region, the second active region, and the field insulating film on the substrate. The gate electrode structure includes a first portion positioned across the first active region and the field insulating film, a second portion positioned across the second active region and the field insulating film, and a third portion directly contacting the first portion and the second portion on the field insulating film. The gate electrode structure further includes a gate electrode including an insertion film traversing the first active region, the field insulating film and the second active region, and a filling film disposed on the insertion film. A thickness of the gate electrode in the third portion of the gate electrode structure is different from a thickness of the gate electrode in the first portion of the gate electrode structure. The thickness of the gate electrode in the third portion of the gate electrode structure is different from a thickness of the gate electrode in the second portion of the gate electrode structure.

According to an exemplary embodiment of the present inventive concept, there is provided a semiconductor device including a substrate including a first active region, a second active region, and a field insulating film directly contacting the first active region and the second active region between the first active region and the second active region; an interlayer insulating film including a trench traversing the first active region, the field insulating film and the second active region, on the substrate; a gate insulating film that extends along a sidewall and a bottom surface of the trench; and a gate electrode structure traversing the first active region, the second active region, and the field insulating film, on the gate insulating film. The gate electrode structure includes a first portion positioned across the first active region and the field insulating film, a second portion positioned across the second active region and the field insulating film, and a third portion directly contacting to the first portion and the second portion on the field insulating film. The gate electrode structure further includes a work function adjustment film positioned across the first active region and the field insulating film, and an upper gate electrode disposed on the work function adjustment film. The gate electrode includes an insertion film traversing the first active region, the field insulating film, and the second active region on the work function adjustment film, and a filling film disposed on the insertion film. A thickness of the work function adjustment film in the third portion of the gate electrode structure is greater than a thickness of the work function adjustment film in the first portion of the gate electrode structure. A thickness of the gate electrode in the third portion of the gate electrode structure is less than a thickness of the gate electrode in the second portion of the gate electrode structure.

According to an exemplary embodiment of the present inventive concept, there is provided a semiconductor device including a first fin-type pattern and a second fin-type pattern which are adjacent to each other; a field insulating film covering a portion of the first fin-type pattern and a portion of the second fin-type pattern, between the first fin-type pattern and the second fin-type pattern; and a gate electrode structure intersecting the first fin-type pattern, the field insulating film, and the second fin-type pattern. The gate electrode structure includes a first portion on the first fin-type pattern and the field insulating film, a second portion on the second fin-type pattern and the field insulating film, and a third portion directly contacting the first portion and the second portion on the field insulating film. The gate electrode structure further includes a gate electrode including an insertion film traversing the first fin-type pattern, the field insulating film, and the second fin-type pattern, and a filling film disposed on the insertion film. A thickness of the gate electrode in the third portion of the gate electrode structure is different from a thickness of the gate electrode in the first portion of the gate electrode structure, and the thickness of the gate electrode in the third portion of the gate electrode structure is different from a thickness of the gate electrode in the second portion of the gate electrode structure.

According to an exemplary embodiment of the present inventive concept, there is provided a semiconductor device including a substrate including a first active region, a second active region, a first field insulating film directly contacting the first active region and the second active region between the first active region and the second active region, a third active region, a fourth active region, and a second field insulating film directly contacting the third active region and the fourth active region between the third active region and the fourth active region; a first gate electrode structure traversing the first active region, the second active region, and the first field insulating film, on the substrate; and a second gate electrode structure traversing the third active region, the fourth active region, and the second field insulating film, on the substrate. The first gate electrode structure includes a first portion positioned across the first active region and the first field insulating film, a second portion positioned across the second active region and the first field insulating film, and a third portion directly contacting the first portion and the second portion on the first field insulating film, the second gate electrode structure includes a fourth portion positioned across the third active region and the second field insulating film, and a fifth portion positioned across the fourth active region and the second field insulating film. The first gate electrode structure further includes a first gate electrode including a first insertion film traversing the first active region, the first field insulating film, and the second active region, and a first filling film disposed on the first insertion film. The second gate electrode structure includes a second gate electrode including a second insertion film traversing the third active region, the second field insulating film, and the fourth active region, and a second filling film disposed on the second insertion film. A thickness of the first gate electrode in the third portion of the first gate electrode structure is different from a thickness of the first gate electrode in the first portion of the first gate electrode structure. The thickness of the first gate electrode in the third portion of the first gate electrode structure is different from a thickness of the first gate electrode in the second portion of the first gate electrode structure. A thickness of the second gate electrode in the fifth portion of the second gate electrode structure is different from a thickness of the second gate electrode in the fourth portion of the second gate electrode structure.

According to an exemplary embodiment of the present inventive concept, there is provided a semiconductor device including a substrate having a first active region and a second active region protruding from a surface of the substrate, and field insulating film disposed between and in contact with the first and second active regions; and a gate electrode including a first metal layer traversing the first and second active regions and the field insulating film, and a second metal layer disposed on the first metal layer. The gate electrode is divided into a first portion, a second portion, and a third portion located between the first and second portions. A thickness of the third portion is different from the first and second portions.

BRIEF DESCRIPTION OF THE DRAWINGS

The present inventive concept will become more apparent to those of ordinary skill in the art by describing in detail exemplary embodiments thereof with reference to the accompanying drawings, in which.

DETAILED DESCRIPTION

Although the drawings referenced herein regarding a semiconductor device according to an exemplary embodiment of the inventive concept exemplify a fin-type transistor (FinFET) including a channel region in a fin-type pattern shape, the inventive concept is not limited thereto. For example, the semiconductor device according to some exemplary embodiments may include a tunneling transistor (tunneling FET), a transistor including nanowire, a transistor including nano-sheet, or a three-dimensional (3D) transistor.

Further, the semiconductor device according to some exemplary embodiments may include a bipolar junction transistor, or a laterally diffused metal oxide semiconductor transistor (LDMOS).

A semiconductor device according to an exemplary embodiment of the inventive concept will be explained below with reference to FIGS. 1 to 3A.

Figure 1:
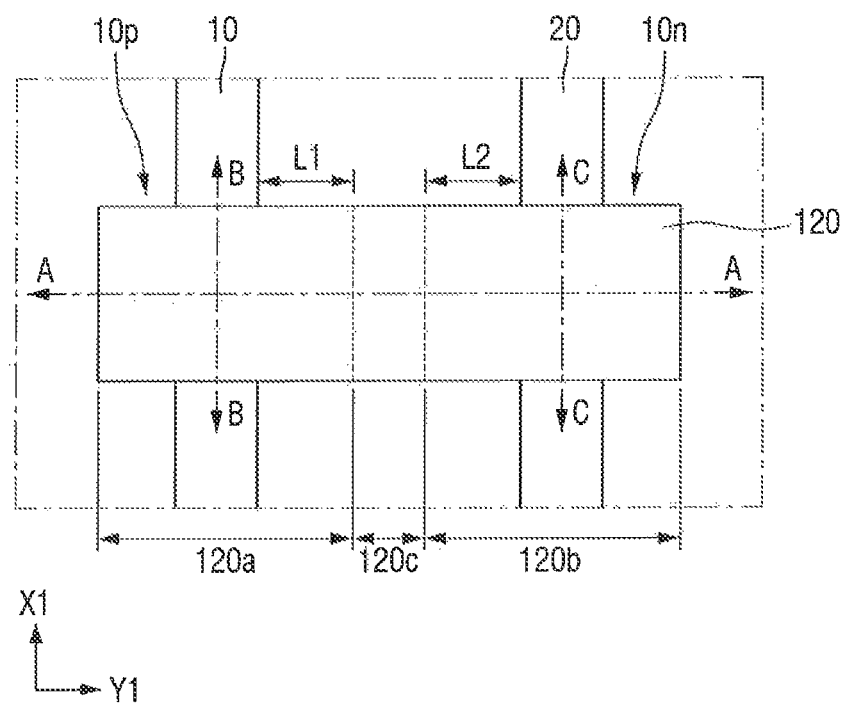
FIG. 1 is a top view provided to explain a semiconductor device according to an exemplary embodiment of the inventive concept.
Figure 2A:
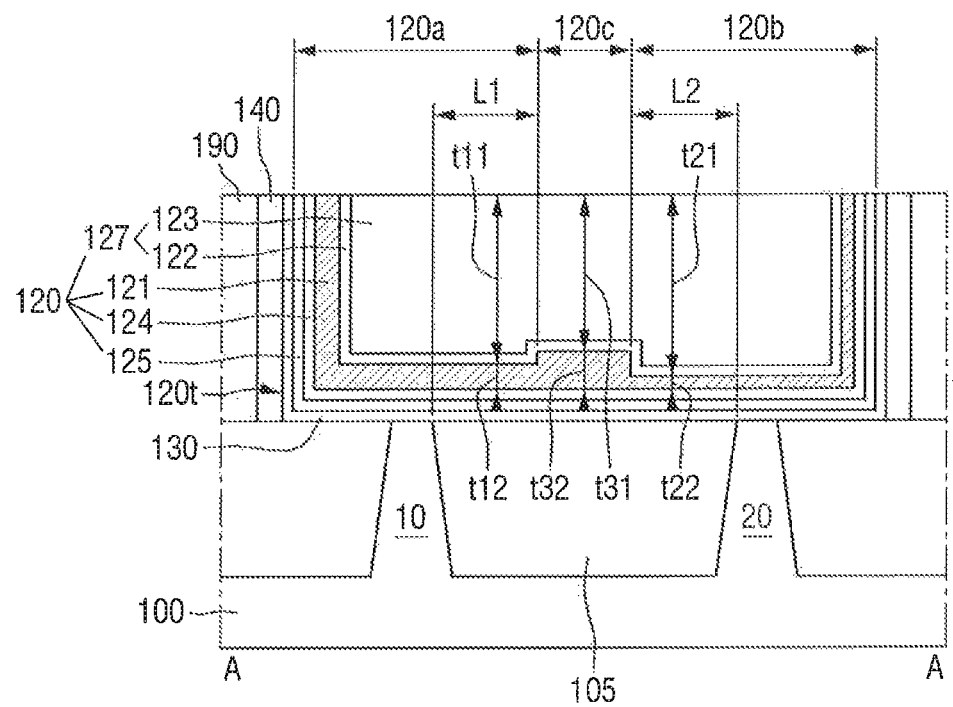
FIGS. 2A and 2B are cross sectional views taken along line A-A of FIG. 1.
Figure 2B:
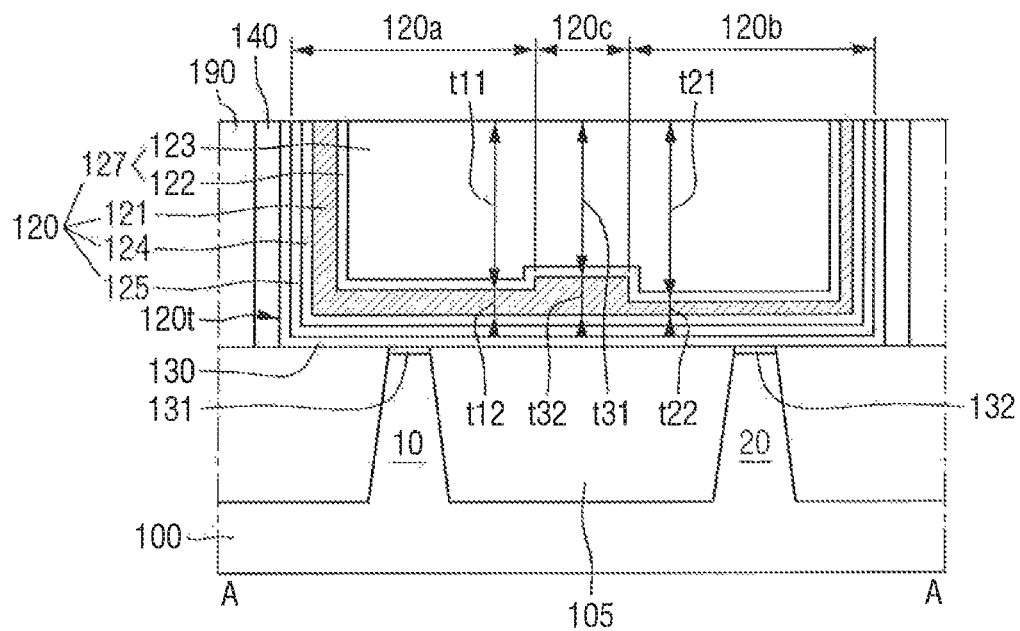
Figure 3A:
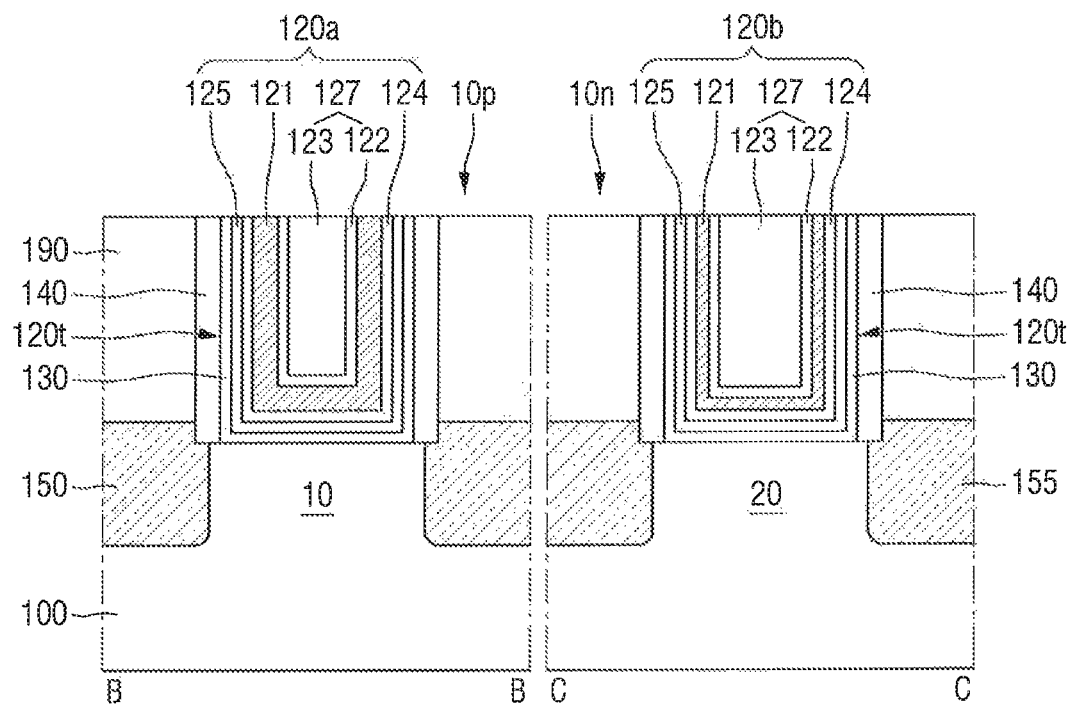
FIGS. 3A and 3B are cross sectional views taken along lines B-B and C-C of FIG. 1.
Figure 3B:
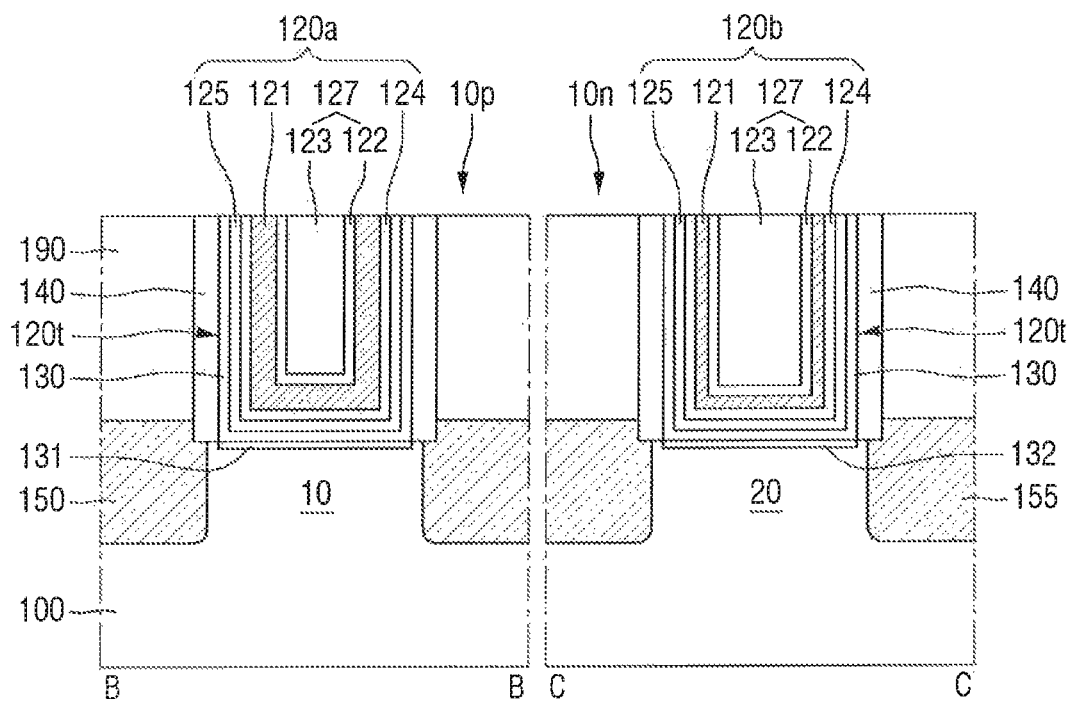

FIG. 1 is a top view provided to explain a semiconductor device according to an exemplary embodiment of the inventive concept. FIGS. 2A and 2B are cross sectional views taken along line A-A of FIG. 1. FIGS. 3A and 3B are cross sectional views taken along lines B-B and C-C of FIG. 1.

For reference, FIG. 1 briefly illustrates only a first active region 10, a second active region 20, and a first gate electrode structure 120 for convenience of explanation.

Referring to FIGS. 1 to 3B, the semiconductor device according to an exemplary embodiment of the inventive concept includes a substrate 100 including the first active region 10, the second active region 20, and a first field insulating film 105, and the first gate electrode structure 120 traversing the first active region 10, the second active region 20, and the first field insulating film 105.

A substrate 100 may be a bulk silicon or a silicon-on-insulator (SOI). Alternatively, the substrate 100 may be a silicon substrate, or may include other material such as silicon germanium, silicon germanium on insulator (SGOI), indium antimonide, lead telluride, indium arsenide, indium phosphide, gallium arsenide, or gallium antimonide, but is not limited thereto.

For convenience of explanation, exemplary embodiments of the inventive concept will be described below based on the assumption that the substrate 100 includes silicon.

The first active region 10 and the second active region 20 may be defined by the first field insulating film 105. The first active region 10 and the second active region 20 may be separated spatially, but may be adjacent to each other.

In an embodiment, the first active region 10 and the second active region 20 have a rectangular shape which extends longitudinally in a first direction X1, but is not limited thereto. The first active region 10 and the second active region 20 may be adjacent to each other in a lengthwise direction and arranged in parallel.

In the first active region 10 and the second active region 20, transistors in the same conductive type may be formed, or alternatively, transistors in different conductive types may be formed.

In a semiconductor device according to an exemplary embodiment of the inventive concept, a positive metal oxide semiconductor (PMOS) (also referred to as a p-type transistor) is formed in the first active region 10 and a negative metal oxide semiconductor (NMOS) (also referred to as an n-type transistor) is formed in the second active region 20.

In this embodiment, the first active region 10 includes a channel region of the p-type transistor and the second active region 20 includes a channel region of the n-type transistor.

In an embodiment, the first active region 10 is an area where a pull-up transistor of a static random access memory (SRAM) is formed, and the second active region 20 is an area where a pull-down transistor or a pass transistor of the SRAM is formed, but is not limited thereto. For example, in other embodiments, the SRAM is replaced with a different type of memory such as a dynamic random access memory (DRAM), magnetoresistive random access memory (MRAM), resistive random access memory (RRAM), or phase-change random access memory (PRAM).

An area in which the PMOS and the NMOS are adjacent with each other and to which a gate voltage is applied by one gate electrode structure may be the first active region 10 and the second active region 20.

In an embodiment, the first field insulating film 105 is formed to surround the first active region 10 and the second active region 20. However, the semiconductor device according to an exemplary embodiment of the inventive concept will be described based on the assumption that the first field insulating film 105 is a portion positioned between the first active region 10 and the second active region 20.

In an embodiment, the first field insulating film 105 is disposed between the first active region 10 and the second active region 20, and directly contacts the first active region 10 and the second active region 20.

That is, the direct contact of the first field insulating film 105 with the first active region 10 and the second active region 20 indicates that another active region is not interposed between the first active region 10 and the second active region 20.

The first field insulating film 105 may include, for example, at least one of an oxide film, a nitride film, an oxynitride film, or a combination thereof.

Further, the first field insulating film 105 may additionally include at least one field liner film formed between the first active region 10 and the first field insulating film 105 and between the second active region 20 and the first field insulating film 105.

When the first field insulating film 105 additionally includes the field liner film, the field liner film may include at least one of polysilicon, amorphous silicon, silicon oxynitride, silicon nitride, or silicon oxide.

The first gate electrode structure 120 may be formed on the substrate 100. In an embodiment, the first gate electrode structure 120 traverses (e.g., crosses) the first active region 10, the second active region 20, and the first field insulating film 105. In an embodiment, the first gate electrode structure 120 extends in a second direction Y1.

In an embodiment, the first gate electrode structure 120 includes a first portion 120a, a second portion 120b, and a third portion 120c located between the first portion 120a and the second portion 120b. In an embodiment, the third portion 120c of the first gate electrode structure directly contacts the first portion 120a of the first gate electrode structure and the second portion 120b of the first gate electrode structure.

In an embodiment, the first portion 120a of the first gate electrode structure is a p-type metal gate electrode. The first portion 120a of the first gate electrode structure is formed on the first active region 10 and the first field insulating film 105. The first portion 120a of the first gate electrode structure is formed across the first active region 10 and the first field insulating film 105.

In an embodiment, the second portion 120b of the first gate electrode structure is an n-type metal gate electrode. The second portion 120b of the first gate electrode structure is formed on the second active region 20 and the first field insulating film 105. The second portion 120b of the first gate electrode structure is formed across the second active region 20 and the first field insulating film 105.

In an embodiment, the third portion 120c of the first gate electrode structure is a connecting gate electrode to connect the p-type metal gate electrode and the n-type metal gate electrode. In an alternative embodiment, the third portion 120c of the first gate electrode structure is a part of the p-type metal gate electrode or a part of the n-type metal gate electrode.

In an embodiment, a first transistor 10p is formed on a region where the first active region 10 and the first gate electrode structure 120 intersect, and a second transistor 10n is formed on a region where the second active region 20 and the first gate electrode structure 120 intersect.

In an embodiment, the first transistor 10p is a p-type transistor, and the second transistor 10n is an n-type transistor. That is, the first transistor 10p and the second transistor 10n, which are different conductive types from each other, may share the first gate electrode structure 120.

Since the first portion 120a of the first gate electrode structure extends on the first field insulating film 105, the first portion 120a of the first gate electrode structure overlaps with a portion of the first field insulating film 105 as well as the first active region 10.

Since the second portion 120b of the first gate electrode structure extends on the first field insulating film 105, the second portion 120b of the first gate electrode structure overlaps with a portion of the first field insulating film 105 as well as the second active region 20.

The third portion 120c of the first gate electrode structure does not extend on the first active region 10 and the second active region 20. The third portion 120c of the first gate electrode structure does not overlap with the first active region 10 and the second active region 20.

In an embodiment, the third portion 120c of the first gate electrode structure contacts the first portion 120a of the first gate electrode structure and the second portion 120b of the first gate electrode structure on the first field insulating film 105.

A distance between the first active region 10 and the third portion 120c of the first gate electrode structure is a first distance L1, and a distance between the second active region 20 and the third portion 120c of the first gate electrode structure is a second distance L2.

Referring to FIGS. 1 and 2A, in an exemplary embodiment, the distance L1 between the first active region 10 and the third portion 120c of the first gate electrode structure is the same as or substantially the same as the distance L2 between the second active region 20 and the third portion 120c of the first gate electrode structure.

In other words, the width L1 by which the first portion 120a of the first gate electrode structure and the first field insulating film 105 overlap with each other may be substantially same as the width L2 by which the second portion 120b of the first gate electrode structure and the first field insulating film 105 overlap with each other.

The following will provide more detail on the first gate electrode structure 120 and the third portion 120c of the first gate electrode structure.

In an embodiment, an interlayer insulating film 190 is formed on the substrate 100. In an embodiment, the interlayer insulating film 190 includes a first trench 120t.

In an embodiment, the first trench 120t traverses the first active region 10, the first field insulating film 105, and the second active region 20. For example, the first trench 120t may intersect the first active region 10 and the second active region 20. The first trench 120t may extend longitudinally in the second direction Y1.

The interlayer insulating film 190 may include, for example, at least one of silicon oxide, silicon nitride, silicon oxynitride, and a low-k dielectric material. The low-k dielectric material may include, for example, flowable oxide (FOX), tonen silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), silk, polyimide, porous polymeric material, or a combination thereof, but is not limited thereto.

In an embodiment, a first spacer 140 is formed on the substrate 100. The first spacer 140 may define the first trench 120t. The first spacer 140 may be formed on a sidewall of the first gate electrode structure 120.

The first gate electrode structure 120 may extend longitudinally in the second direction Y1. Thereby, the first gate electrode structure 120 may include a long side that extends in the second direction Y1 and a short side that extends in the first direction X1.

Referring to FIGS. 2A to 3B, the first spacer 140 is illustrated as being formed on both the sidewall including the long side of the first gate electrode structure 120 and the sidewall including the short side of the first gate electrode structure 120, but it not limited thereto.

Differently from the illustration in FIGS. 2A to 3B, the first spacer 140 may be formed on the sidewall including the long side of the first gate electrode structure 120, and not formed on the sidewall including the short side of the first gate electrode structure 120.

In an embodiment, a thickness of the first spacer 140 formed on the sidewall including the long side of the first gate electrode structure 120 is different from a thickness of the first spacer 140 formed on the sidewall including the short side of the first gate electrode structure 120.

For example, the first spacer 140 may include at least one of silicon nitride (SiN), silicon oxynitride (SiON), silicon oxide ($SiO_2$), silicon oxycarbonitride (SiOCN), and a combination thereof.

While the first spacer 140 is illustrated as a single film, this is only for convenience of explanation and exemplary embodiments are not limited thereto. When the first spacer 140 is a plurality of films, at least one film among the films included in the first spacer 140 may include a low-k dielectric material such as silicon oxycarbonitride (SiOCN).

Further, when the first spacer 140 is a plurality of films, at least one film among the films included in the first spacer 140 may have an L-shape.

In some embodiments, the first spacer 140 may serve as a guide in the forming of a self aligned contact. Thus, the first spacer 140 may include a material having an etch selectivity with respect to the interlayer insulating film 190.

The first gate insulating film 130 may be formed on the substrate 100. The first gate insulating film 130 may be formed on the first active region 10, the second active region 20, and the first field insulating film 105.

In an embodiment, the first gate insulating film 130 extends along a sidewall and a bottom surface of the first trench 120t. The first gate insulating film 130 extended along the bottom surface of the first trench 120t traverses the first active region 10, the first field insulating film 105 and the second active region 20.

The first gate insulating film 130 may include a high-k dielectric insulating film. The high-k dielectric insulating film may include one or more of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Further, while the high-k dielectric insulating film is explained mainly with reference to oxides, alternatively, the high-k dielectric insulating film may include one or more of the nitrides (e.g., hafnium nitride) or the oxynitrides (e.g., hafnium oxynitride) of the metal materials described above, but is not limited thereto.

Differently from the illustration in FIGS. 2A and 3A, a first interfacial layer 131 and a second interfacial layer 132 may be respectively formed between the first gate insulating film 130 and the first active region 10 and between the first gate insulating film 130 and the second active region 20, with reference to FIGS. 2B and 3B.

In a forming method according to an exemplary embodiment of the inventive concept, the first and second interfacial layers 131, 132 are formed only on the first active region 10 and the second active region 20. In an alternative embodiment of the forming method, the first and second interfacial layers 131, 132 are formed along the sidewall and the bottom surface of the first trench 120t (i.e., an upper surface of the first field insulating film 105 and a sidewall of the first spacer 140).

According to the type of the substrate 100 or the type of the first gate insulating film 130, the first and second interfacial layers 131, 132 may include different materials. When the substrate 100 is a silicon substrate, the first and second interfacial layers 131, 132 may include, for example, a silicon oxide.

Referring to FIGS. 2B and 3B, it is illustrated that the upper surface of the first and second interfacial layers 131, 132 are located on a same plane as the upper surface of the first field insulating film 105, but this is provided for convenience of explanation and other exemplary embodiments are not limited thereto.

The first gate electrode structure 120 may be formed on the first gate insulating film 130. The first gate insulating film 130 may be formed between the first gate electrode structure 120 and the substrate 100. The first gate insulating film 130 may be formed below the first gate electrode structure 120.

In an embodiment, the first gate electrode structure 120 fills the first trench 120t. The upper surface of the first gate electrode structure 120 may be located on a same plane as the upper surface of the first spacer 140 and the upper surface of the interlayer insulating film 190.

In an embodiment, the first gate electrode structure 120 includes a first lower conductive film 125, a first etch prevention film 124, a first work function adjustment film 121, a first insertion film 122 and a first filling film 123, which are sequentially formed on the first gate insulating film 130.

The first lower conductive film 125 may be formed on the first gate insulating film 130. The first lower conductive film 125 may be formed on the first active region 10, the second active region 20, and the first field insulating film 105.

In an embodiment, the first lower conductive film 125 extends along the sidewall and the bottom surface of the first trench 120t. The first lower conductive film 125 may extend along a profile of the first gate insulating film 130.

In an embodiment, the first lower conductive film 125 extended along the bottom surface of the first trench 120t traverses the first active region 10, the first field insulating film 105, and the second active region 20.

The first lower conductive film 125 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), and tantalum aluminum nitride (TaAlN).

In a semiconductor device according to at least one exemplary embodiment of the inventive concept, the first lower conductive film 125 includes titanium nitride (TiN).

The first etch prevention film 124 may be formed on the first lower conductive film 125. The first lower conductive film 125 may be formed on the first active region 10, the second active region 20, and the first field insulating film 105.

In an embodiment, the first etch prevention film 124 extends along the sidewall and the bottom surface of the first trench 120t. The first etch prevention film 124 may extend along the profile of the first lower conductive film 125.

In an embodiment, the first etch prevention film 124 extended along the bottom surface of the first trench 120t traverses the first active region 10, the first field insulating film 105, and the second active region 20.

The first etch prevention film 124 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), and tantalum aluminum nitride (TaAlN).

In the semiconductor device according to the exemplary embodiment, the first etch prevention film 124 includes tantalum nitride (TaN).

The first work function adjustment film 121 may be formed on the first etch prevention film 124. The first work function adjustment film 121 may be formed on the first active region 10, the second active region 20, and the first field insulating film 105.

In an embodiment, the first work function adjustment film 121 extends along the sidewall and the bottom surface of the first trench 120t. The first work function adjustment film 121 may extend along the profile of the first etch prevention film 124.

In an exemplary embodiment, the first work function adjustment film 121 extended along the bottom surface of the first trench 120t traverses the first active region 10, the first field insulating film 105, and the second active region 20.

The first work function adjustment film 121 may include, for example, titanium nitride (TiN).

In an embodiment, a thickness t12 of the first work function adjustment film 121 in the first portion 120a of the first gate electrode structure is different from a thickness t32 of the first work function adjustment film 121 in the third portion 120c of the first gate electrode structure. In an embodiment, the thickness t12 is less than the thickness t32.

In an embodiment, a thickness t22 of the first work function adjustment film 121 in the second portion 120b of the first gate electrode structure is different from the thickness t32 of the first work function adjustment film 121 in the third portion 120c of the first gate electrode structure. In an embodiment, the thickness t22 is less than the thickness t32.

In an embodiment, the thickness t12 of the first work function adjustment film 121 in the first portion 120a of the first gate electrode structure is different from the thickness t22 of the first work function adjustment film 121 in the second portion 120b of the first gate electrode structure. In an embodiment, the thickness t22 is less than the thickness t12.

Referring to FIGS. 2A and 2B, in an embodiment, the thickness t32 of the first work function adjustment film 121 in the third portion 120c of the first gate electrode structure is greater than the thickness t12 of the first work function adjustment film 121 in the first portion 120a of the first gate electrode structure, and greater than the thickness t22 of the first work function adjustment film 121 in the second portion 120b of the first gate electrode structure.

In an exemplary embodiment, the thickness t12 of the first work function adjustment film 121 in the first portion 120a of the first gate electrode structure is greater than the thickness t22 of the first work function adjustment film 121 in the second portion 120b of the first gate electrode structure. In this embodiment, the thickness t12 of the first work function adjustment film 121 in the first active region 10 is greater than the thickness t22 of the first work function adjustment film 121 on the second active region 20.

Referring to FIGS. 2A and 2B, the first portion 120a, the second portion 120b, and the third portion 120c included in the first gate electrode structure 120 may be defined and distinguished by the changes in the thickness of the first work function adjustment film 121.

Referring to FIGS. 2A and 2B, in an embodiment, the thickness of the first work function adjustment film 121 between the first active region 10 and the second active region 20 is maintained at a certain value, and is then increased. In an embodiment, the thickness of the first work function adjustment film 121 decreases, and is then maintained at a certain value.

In an exemplary embodiment, the first work function adjustment film 121 between the first active region 10 and the second active region 20 includes a portion having a thickness greater than the thickness t12 of the first work function adjustment film on the first active region 10 and the thickness t22 of the first work function adjustment film 121 on the second active region 20.

The first insertion film 122 may be formed on the first work function adjustment film 121. The first insertion film 122 may be formed on the first active region 10, the second active region 20, and the first field insulating film 105.

In an embodiment, the first insertion film 122 extends along the sidewall and the bottom surface of the first trench 120t. The first insertion film 122 may extend along the profile of the first work function adjustment film 121.

In an embodiment, the first insertion film 122 extended along the bottom surface of the first trench 120t traverses the first active region 10, the first field insulating film 105, and the second active region 20.

The first insertion film 122 may include, for example, one of titanium (Ti), titanium aluminum (TiAl), titanium aluminum nitride (TiAlN), titanium aluminum carbide (TiAlC), and titanium aluminum carbonitride (TiAlCN).

In a semiconductor device according to at least one exemplary embodiment, the first insertion film 122 includes titanium aluminum (TiAl).

The first filling film 123 may be formed on the first insertion film 122. The first filling film 123 may be formed on the first active region 10, the second active region 20, and the first field insulating film 105.

The first filling film 123 may include, for example, at least one of tungsten (W), aluminum (Al), cobalt (Co), copper (Cu), ruthenium (Ru), nickel (Ni), platinum (Pt), nickel platinum (Ni—Pt), and titanium nitride (TiN).

The first insertion film 122 and the first filling film 123 on the first work function adjustment film 121 form a first upper gate electrode 127.

In an embodiment, a thickness t11 of the first upper gate electrode 127 in the first portion 120a of the first gate electrode structure is different from a thickness t31 of the first upper gate electrode 127 in the third portion 120c of the first gate electrode structure.

In an embodiment, a thickness t21 of the first upper gate electrode 127 in the second portion 120b of the first gate electrode structure is different from the thickness t31 of the first upper gate electrode 127 in the third portion 120c of the first gate electrode structure.

In an exemplary embodiment, the thickness t11 of the first upper gate electrode 127 in the first portion 120a of the first gate electrode structure is different from the thickness t21 of the first upper gate electrode 127 in the second portion 120b of the first gate electrode structure.

Referring to FIGS. 2A and 2B, in an exemplary embodiment, the thickness t31 of the first upper gate electrode 127 in the third portion 120c of the first gate electrode structure is less than the thickness t11 of the first upper gate electrode 127 in the first portion 120a of the first gate electrode structure, and less than the thickness t21 of the first upper gate electrode 127 in the second portion 120b of the first gate electrode structure.

In an exemplary embodiment, the thickness t11 of the first upper gate electrode 127 in the first portion 120a of the first gate electrode structure is less than the thickness t21 of the first upper gate electrode 127 in the second portion 120b of the first gate electrode structure.

The thicknesses t11, t21, t31 of the first upper gate electrode 127 may be distances from the upper surface of the interlayer insulating film 190 to the first work function adjustment film 121 on the bottom surface of the first trench 120t.

Referring to FIGS. 2A to 3B, it is illustrated that the first lower conductive film 125 and the first etch prevention film 124 are formed between the first work function adjustment film 121 and the first gate insulating film 130, but the inventive concept is not limited thereto. One of the first lower conductive film 125 and the first etch prevention film 124 may be removed, or another additional film may be formed.

In an embodiment, a first source/drain 150 is formed on both sides of the first portion 120a of the first gate electrode structure, and a second source/drain 155 is formed on both sides of the second portion 120b of the first gate electrode structure.

The first source/drain 150 and the second source/drain 155 may be epitaxial layers formed within the substrate 100. However, the source/drains 150 and 155 are not limited to epitaxial layers. The first source/drain 150 and the second source/drain 155 may be an impurity region formed by injecting an impurity into the substrate 100.

In an exemplary embodiment, the first source/drain 150 and the second source/drain 155 are raised source/drains including an upper surface which protrudes upward further than the upper surface of the substrate 100.

Figure 4:
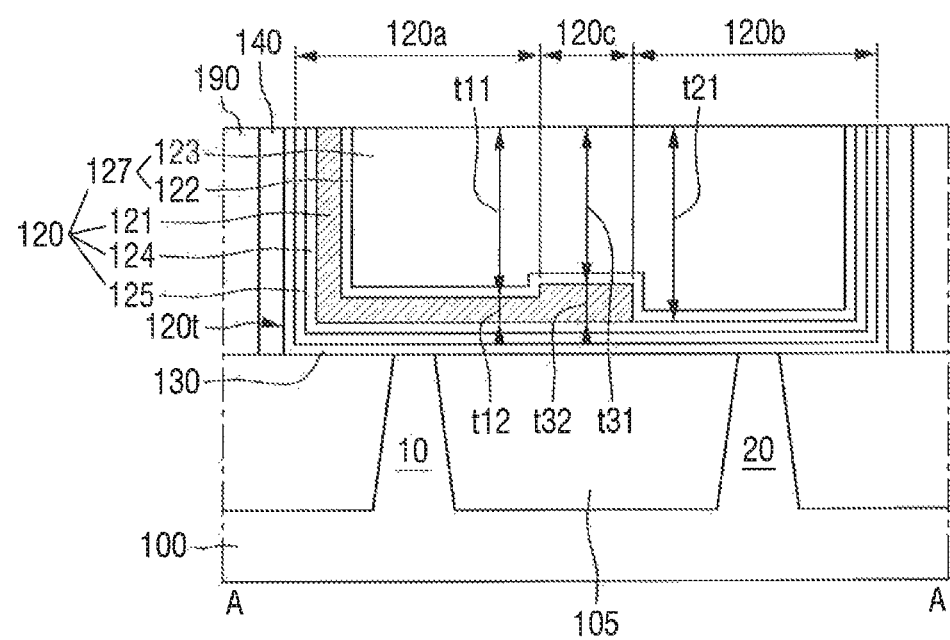
FIG. 4 is a view provided to explain a semiconductor device according to an exemplary embodiment of the inventive concept.

FIG. 4 is a view provided to explain a semiconductor device according to an exemplary embodiment of the inventive concept. For convenience of explanation, differences that are not explained above with reference to FIGS. 1 to 3B will be mainly explained below.

Referring to FIG. 4, in a semiconductor device according to an exemplary embodiment of the inventive concept, the first work function adjustment film 121 is not formed on the second active region 20.

The first work function adjustment film 121 is formed across the first active region 10 and the first field insulating film 105, but does not overlap with the second active region 20.

In other words, the second portion 120b of the first gate electrode structure formed on the second active region 20 and the first field insulating film 105 does not include the first work function adjustment film 121.

In an embodiment, the first etch prevention film 124 in the second portion 120b of the first gate electrode structure contacts the first insertion film 122. In an embodiment, the first etch prevention film 124 in the second portion 120b of the first gate electrode structure contacts the first upper gate electrode 127.

Figure 5:
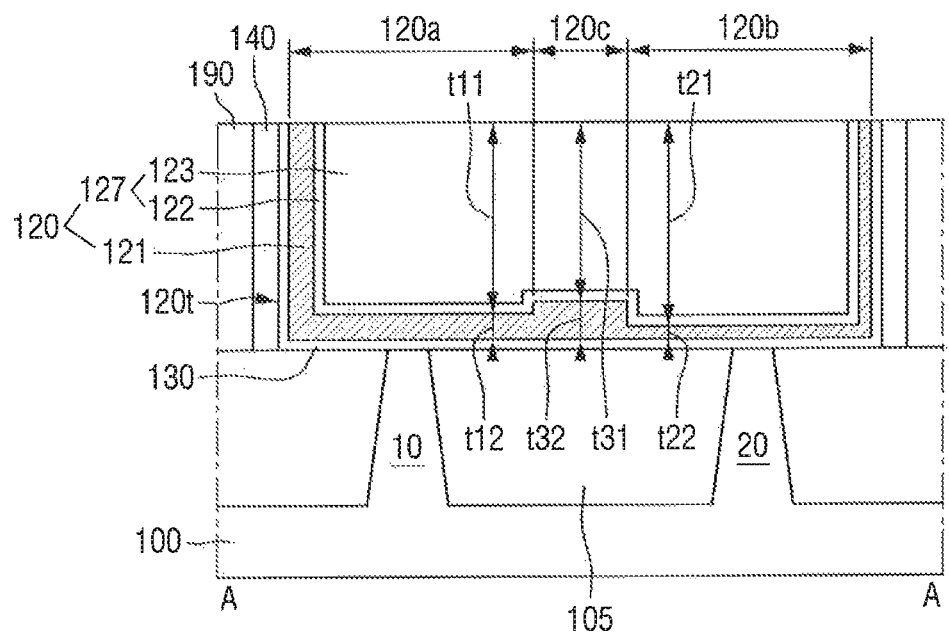
FIGS. 5 and 6 are views provided to explain a semiconductor device according to an exemplary embodiment of the inventive concept.
Figure 6:
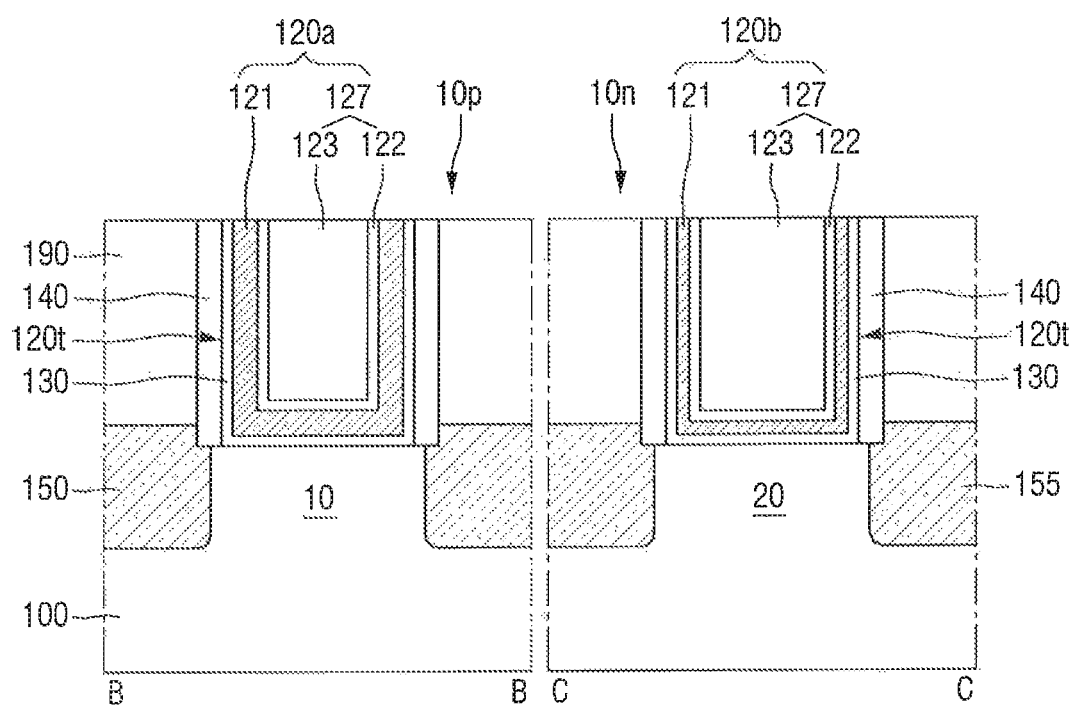

FIGS. 5 and 6 are views provided to explain a semiconductor device according to an exemplary embodiment of the inventive concept. For convenience of explanation, differences that are not explained above with reference to FIGS. 1 to 3B will be mainly explained below.

For reference, FIG. 5 is a cross sectional view taken on line A-A of FIG. 1, and FIG. 6 is a cross sectional view taken on lines B-B and C-C of FIG. 1.

Referring to FIGS. 5 and 6, in a semiconductor device according to an exemplary embodiment of the inventive concept, the first work function adjustment film 121 contacts the first gate insulating film 130.

The first gate electrode structure 120 includes the first work function adjustment film 121, the first insertion film 122 and the first filling film 123, which are sequentially formed on the first gate insulating film 130.

In an embodiment, a conductive film is not interposed between the first gate insulating film 130 and the first work function adjustment film 121.

As illustrated in FIG. 5, in an embodiment, the thickness t32 of the first work function adjustment film 121 in the third portion 120c of the first gate electrode structure is greater than the thickness t12 of the first work function adjustment film 121 in the first portion 120a of the first gate electrode structure, and greater than the thickness t22 of the first work function adjustment film 121 in the second portion 120b of the first gate electrode structure.

Further, in an embodiment, the thickness t12 of the first work function adjustment film 121 in the first portion 120a of the first gate electrode structure is greater than the thickness t22 of the first work function adjustment film 121 in the second portion 120b of the first gate electrode structure.

In an exemplary embodiment, the thickness t31 of the first upper gate electrode 127 in the third portion 120c of the first gate electrode structure is less than the thickness t11 of the first upper gate electrode 127 in the first portion 120a of the first gate electrode structure, and less than the thickness t21 of the first upper gate electrode 127 in the second portion 120b of the first gate electrode structure.

In an embodiment, the thickness t11 of the first upper gate electrode 127 in the first portion 120a of the first gate electrode structure is less than the thickness t21 of the first upper gate electrode 127 in the second portion 120b of the first gate electrode structure.

Figure 7:
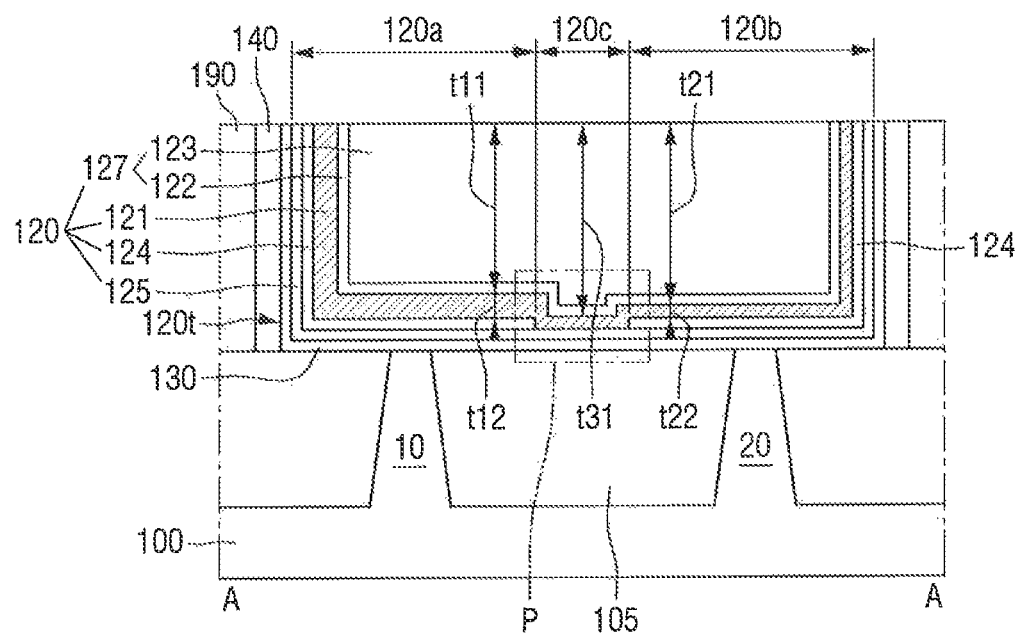
FIG. 7 is a view provided to explain a semiconductor device according to an exemplary embodiment of the inventive concept.
Figure 8A:
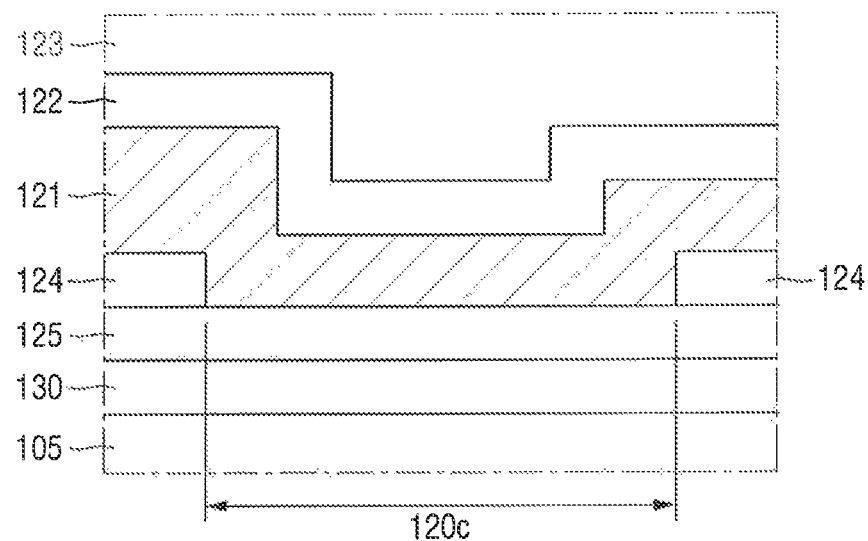
FIGS. 8A and 8B are enlarged views of the encircled section P of FIG. 7.
Figure 8B:
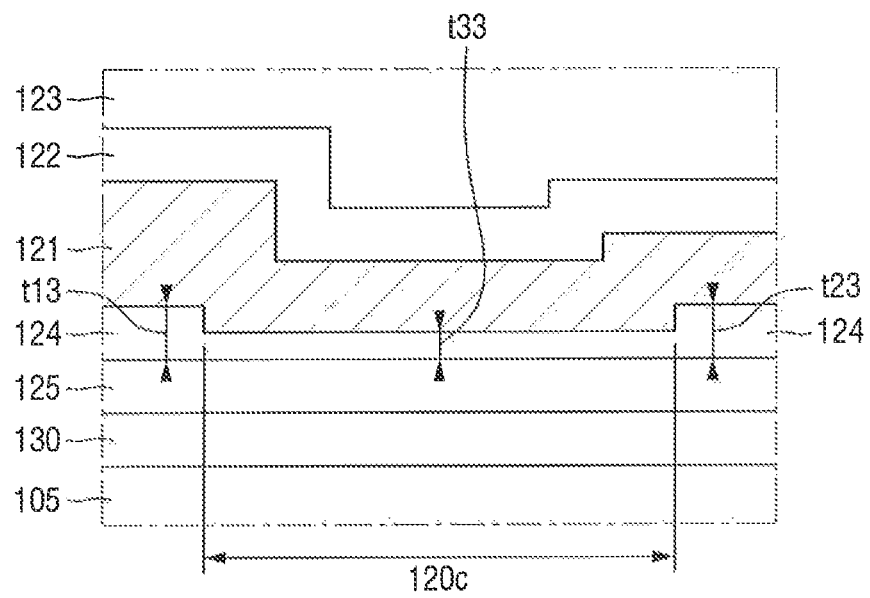

FIG. 7 is a view provided to explain a semiconductor device according to an exemplary embodiment of the inventive concept. FIGS. 8A and 8B are enlarged views of the encircled section P of FIG. 7. For convenience of explanation, differences that are not explained above with reference to FIGS. 1 to 3B will be mainly explained below.

Referring to FIGS. 7 to 8B, in a semiconductor device according to an exemplary embodiment of the inventive concept, the thickness t31 of the first upper gate electrode 127 in the third portion 120c of the first gate electrode structure is greater than the thickness t11 of the first upper gate electrode 127 in the first portion 120a of the first gate electrode structure.

In an embodiment, the thickness t31 of the first upper gate electrode 127 in the third portion 120c of the first gate electrode structure is greater than the thickness t21 of the first upper gate electrode 127 in the second portion 120b of the first gate electrode structure.

In an embodiment, the thickness t11 of the first upper gate electrode 127 in the first portion 120a of the first gate electrode structure is less than the thickness t21 of the first upper gate electrode 127 in the second portion 120b of the first gate electrode structure.

In an embodiment, the thickness t12 of the first work function adjustment film 121 in the first portion 120a of the first gate electrode structure is greater than the thickness t22 of the first work function adjustment film 121 in the second portion 120b of the first gate electrode structure. In an embodiment, the thickness t12 of the first work function adjustment film 121 on the first active region 10 is greater than the thickness t22 of the first work function adjustment film 121 on the second active region 20.

In an embodiment, the thickness of the first work function adjustment film 121 in the third portion 120c of the first gate electrode structure is equal to or substantially equal to the thickness t22 of the first work function adjustment film 121 in the second portion 120b of the first gate electrode structure, but is not limited thereto.

In an embodiment, the width of the gate electrode 127 in the entire third portion 120c is less than the width of the gate electrode 127 in first portion 120a. In an embodiment, the width of the gate electrode 127 in the entire third portion 120c is less than the width of the gate electrode 127 in the second portion 120b.

In FIG. 8A, the first etch prevention film 124 is partially removed on the first field insulating film 105. In an embodiment, the first work function adjustment film 121 and the first lower conductive film 125 contact each other on the portion in which the first etch prevention film 124 has been partially removed.

In an embodiment, the third portion 120c of the first gate electrode structure is defined by the portion in which the first etch prevention film 124 has been partially removed. That is, the third portion 120c of the first gate electrode structure does not include the first etch prevention film 124.

When the first lower conductive film 125 and the first work function adjustment film 121 respectively include titanium nitride (TiN), the first portion 120a of the first gate electrode structure and the second portion 120b of the first gate electrode structure respectively include titanium nitride films which are two branches that split off from titanium nitride material included in the third portion 120c of the first gate electrode structure.

Referring to FIG. 8B, the thickness of a portion of the first etch prevention film 124 becomes thinner on the first field insulating film 105. For example, a thickness of the first etch prevention film 124 changes from t13 to t23. The third portion 120c of the first gate electrode structure may be defined by the decreased thickness portion of the first etch prevention film 124 on the first field insulating film 105.

In an embodiment, a thickness t33 of the first etch prevention film 124 in the third portion 120c of the first gate electrode structure is less than a thickness t13 of the first etch prevention film 124 in the first portion 120a of the first gate electrode structure. In an embodiment, the thickness t33 of the first etch prevention film 124 in the third portion 120c of the first gate electrode structure is less than a thickness t23 of the first etch prevention film 124 in the second portion 120b of the first gate electrode structure.

Referring to FIGS. 7 to 8B, the first portion 120a, the second portion 120b, and the third portion 120c included in the first gate electrode structure 120 may be defined and distinguished by the changes in the thickness of the first etch prevention film 124.

Figure 9:
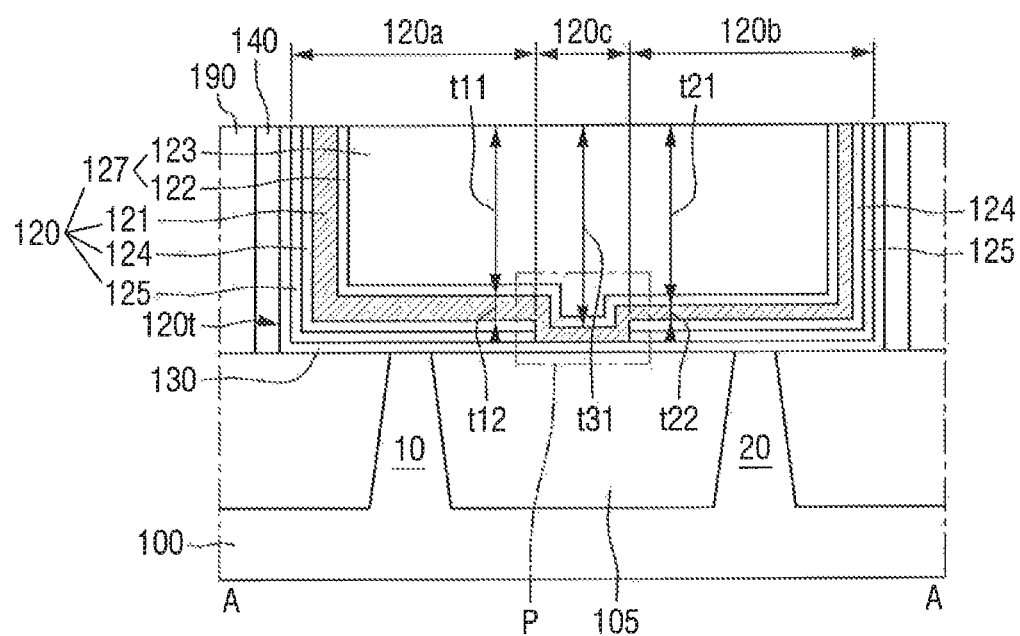
FIG. 9 is a view provided to explain a semiconductor device according to an exemplary embodiment of the inventive concept.
Figure 10A:
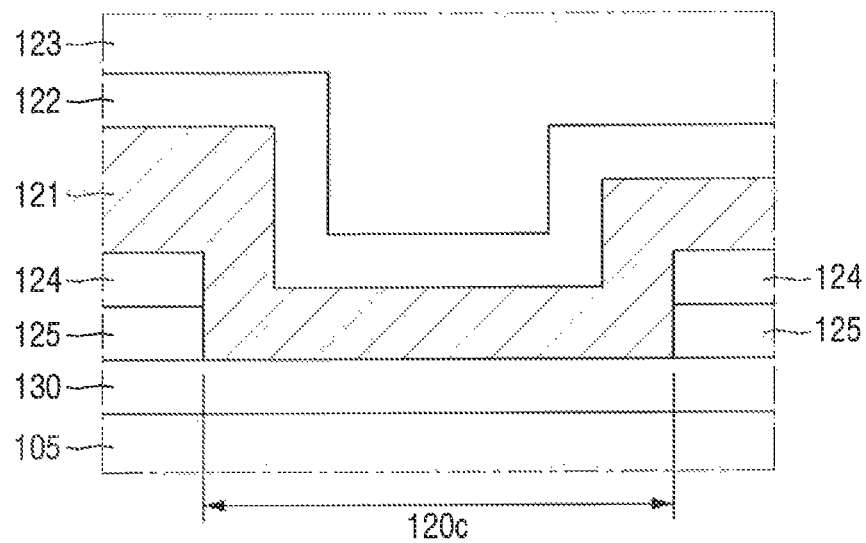
FIGS. 10A and 10B are enlarged views of the encircled section P of FIG. 9 according to an exemplary embodiment of the inventive concept.
Figure 10B:
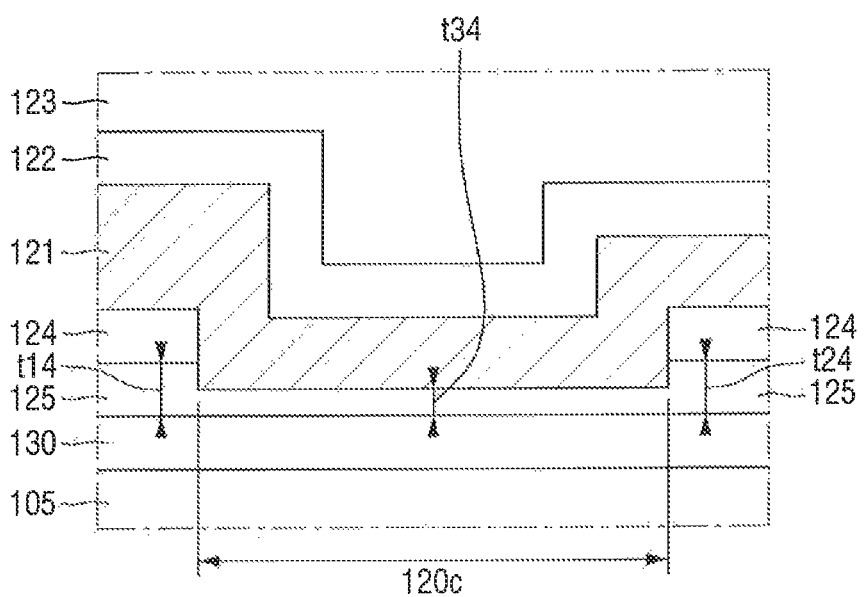

FIG. 9 is a view provided to explain a semiconductor device according to an exemplary embodiment of the inventive concept. FIGS. 10A and 10B are enlarged views of the encircled section P of FIG. 9. For convenience of explanation, differences that are not explained above with reference to FIG. 7 to FIG. 8B will be mainly explained below.

Referring to FIGS. 9 and 10A, in an embodiment, the first lower conductive film 125 on the first field insulating film 105 is partially removed.

In an embodiment, the first work function adjustment film 121 contacts the first gate insulating film 130 on the portion in which the first lower conductive film 125 has been partially removed.

The first etch prevention film 124 is not included on the portion in which the first lower conductive film 125 has been partially removed.

The third portion 120c of the first gate electrode structure may be defined by the portion in which the first lower conductive film 125 has been partially removed. That is, the third portion 120c of the first gate electrode structure excludes the first etch prevention film 124 and the first lower conductive film 125.

Referring to FIGS. 9 and 10B, the thickness of a portion of the first lower conductive film 125 on the first field insulating film 105 may become thinner. For example, a thickness of the first lower conductive film 125 changes from t14 to t34.

The third portion 120c of the first gate electrode structure may be defined by the decreased thickness portion of the first lower conductive film 125 on the first field insulating film 105.

The third portion 120c of the first gate electrode structure excludes the first etch prevention film 124.

In an embodiment, a thickness t34 of the first lower conductive film 125 in the third portion 120c of the first gate electrode structure is less than a thickness t14 of the first lower conductive film 125 in the first portion 120a of the first gate electrode structure. In an embodiment, a thickness t34 of the first lower conductive film 125 in the third portion 120c of the first gate electrode structure is less than a thickness t24 of the first lower conductive film 125 in the second portion 120b of the first gate electrode structure.

As illustrated in FIGS. 9 to 10B, the first portion 120a, the second portion 120b and the third portion 120c included in the first gate electrode structure 120 may be defined and distinguished by the changes in the thickness of the first lower conductive film 125.

Figure 11:
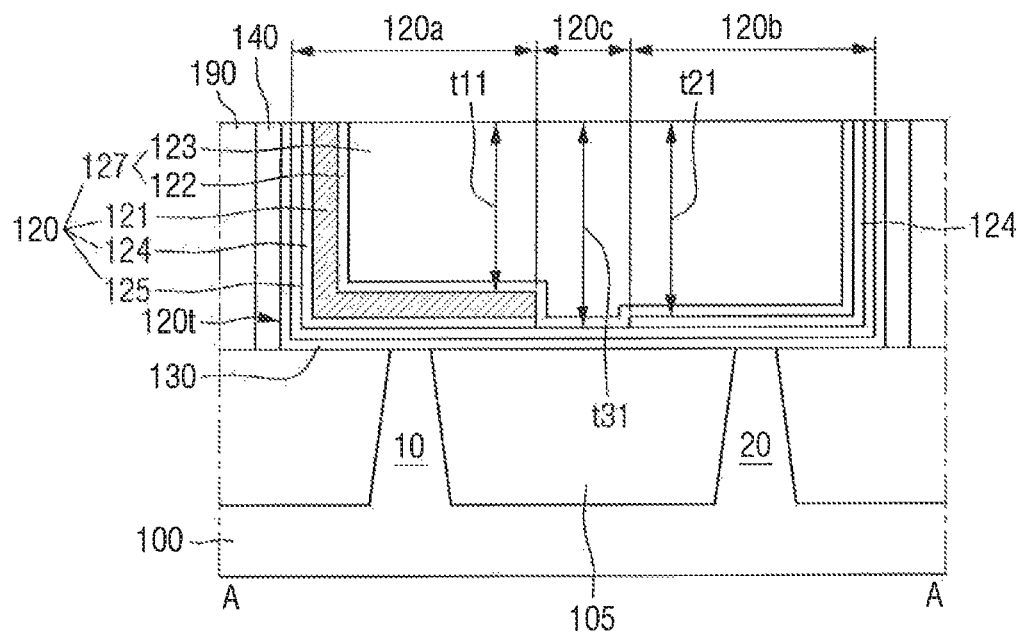
FIG. 11 is a view provided to explain a semiconductor device according to an exemplary embodiment of the inventive concept.

FIG. 11 is a view provided to explain a semiconductor device according to an exemplary embodiment of the inventive concept. For convenience of explanation, differences that are not explained above with reference to FIGS. 7 to 8B will be mainly explained below.

Referring to FIG. 11, in the semiconductor device according to an exemplary embodiment of the inventive concept, the first work function adjustment film 121 is not formed on the second active region 20.

The first work function adjustment film 121 is formed across the first active region 10 and the first field insulating film 105, but does not overlap with the second active region 20.

In other words, the second portion 120b of the first gate electrode structure formed on the second active region 20 and the first field insulating film 105 does not include the first work function adjustment film 121.

In an embodiment, the first etch prevention film 124 in the second portion 120b of the first gate electrode structure contacts the first insertion film 122. In an embodiment, the first etch prevention film 124 in the second portion 120b of the first gate electrode structure contacts the first upper gate electrode 127.

In an embodiment, the third portion 120c of the first gate electrode structure excludes the first work function adjustment film 121, but is not limited thereto.

Figure 12:
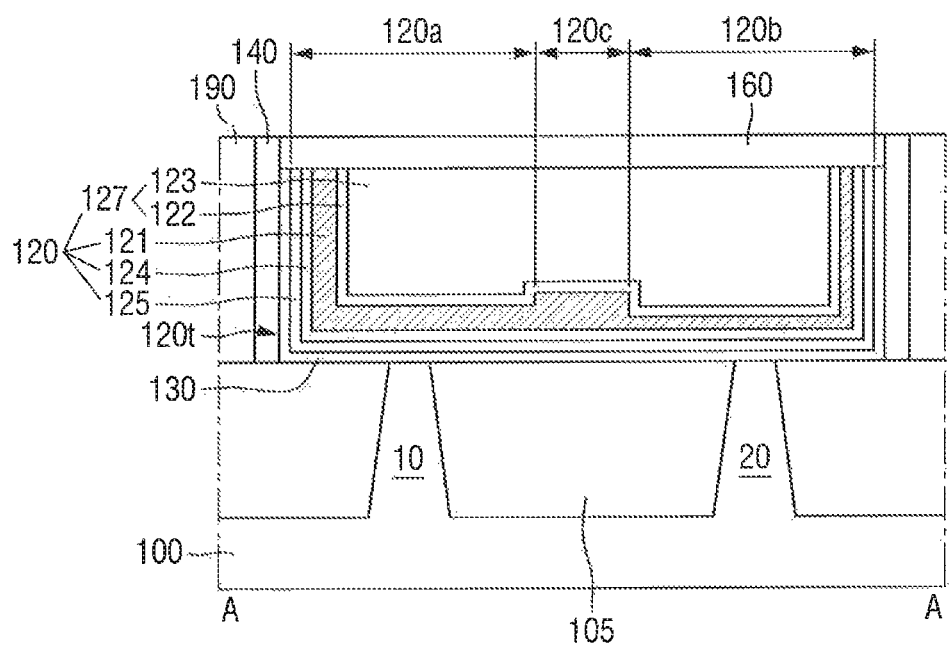
FIG. 12 is a view provided to explain a semiconductor device according to an exemplary embodiment of the inventive concept.
Figure 13:
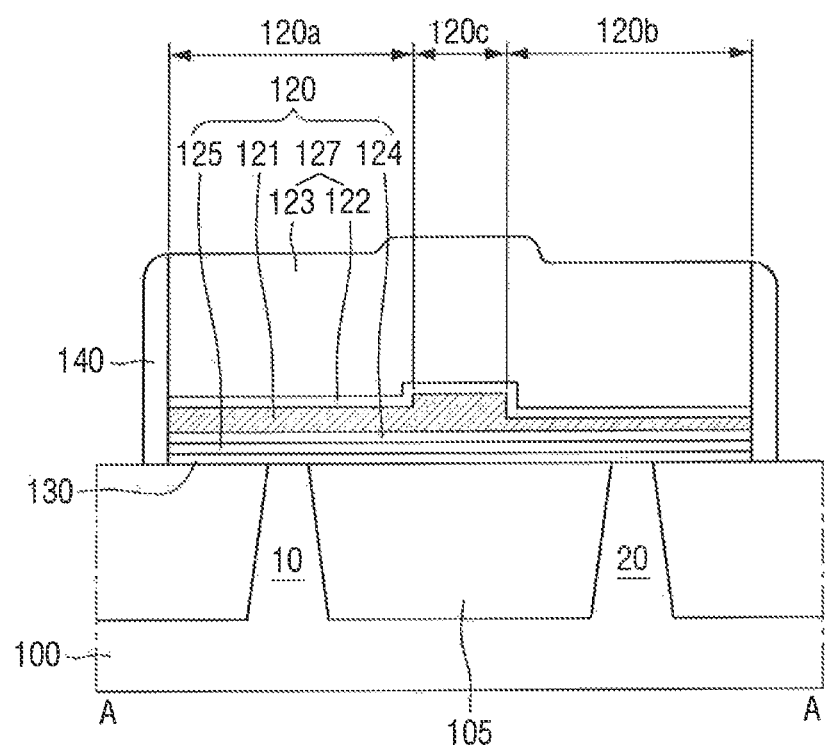
FIG. 13 is a view provided to explain a semiconductor device according to an exemplary embodiment of the inventive concept.

FIG. 12 is a view provided to explain a semiconductor device according to an exemplary embodiment of the inventive concept. FIG. 13 is a view provided to explain a semiconductor device according to an exemplary embodiment of the inventive concept. For convenience of explanation, differences that are not explained above with reference to FIGS. 1 to 3B will be mainly explained below.

Referring to FIG. 12, the semiconductor device according to an exemplary embodiment of the inventive concept further includes a capping pattern 160.

In an embodiment, the first gate electrode structure 120 fills a portion of the first trench 120t. In an embodiment, an upper surface of the first gate electrode structure 120 is recessed more than an upper surface of the interlayer insulating film 190.

In this embodiment, the capping pattern 160 is formed on the first gate electrode structure 120. In other words, the capping pattern 160 may be formed on the first upper gate electrode 127. In an embodiment, the capping pattern 160 fills the remainder of the first trench 120t unfilled by the first gate electrode structure 120.

Because the capping pattern 160 is formed by filling the portion of the first trench 120t, the upper surface of the capping pattern 160 may be located on the same plane as the upper surface of the first spacer 140 and the upper surface of the interlayer insulating film 190.

Because the capping pattern 160 may serve as a guide for forming a self aligned contact, the capping pattern 160 may include a material having an etch selectivity with respect to the interlayer insulating film 190.

The capping pattern 160 may include, for example, at least one of silicon nitride (SiN), silicon oxynitride (SiON), silicon oxide ($SiO_2$), silicon carbonitride (SiCN), silicon oxycarbonitride (SiOCN) and a combination thereof.

Unlike what is illustrated in the drawings, the first gate insulating film 130 may extend between the first spacer 140 and the capping pattern 160. That is, a portion of the first gate insulating film 130 may be extended between an inner sidewall of the first spacer 140 and the capping pattern 160 which face each other.

Referring to FIG. 13, in a semiconductor device according to an exemplary embodiment of the inventive concept, the first gate insulating film 130 excludes a portion illustrated in FIG. 12 which extends between the first gate electrode structure 120 and the first spacer 140.

In this embodiment, each of the first lower conductive film 125, the first etch prevention film 124, the first work function adjustment film 121, and the first insertion film 122 exclude the portion thereof shown in FIG. 12 that extends along the inner sidewall of the first spacer 140.

Figure 14:
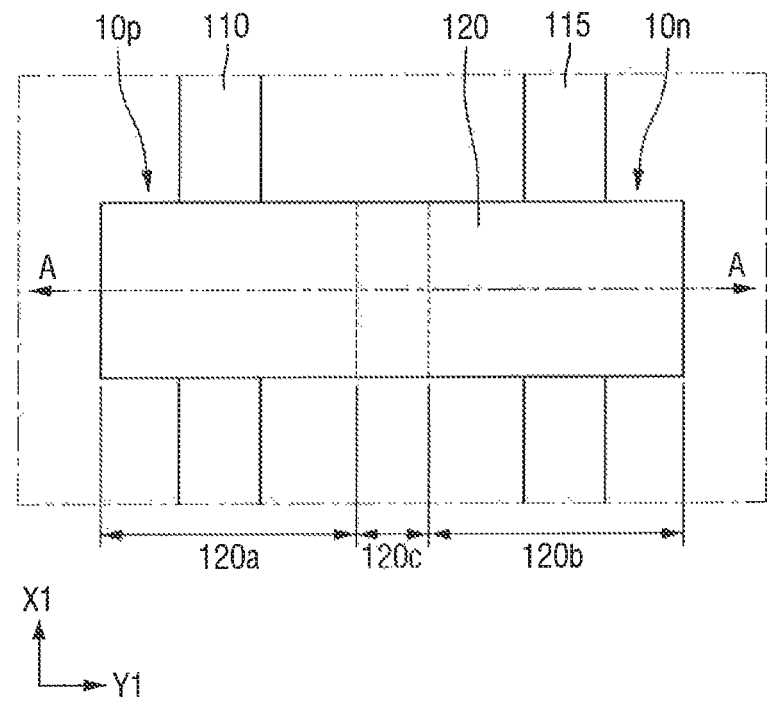
FIG. 14 is a top view provided to explain a semiconductor device according to an exemplary embodiment of the inventive concept.
Figure 15:
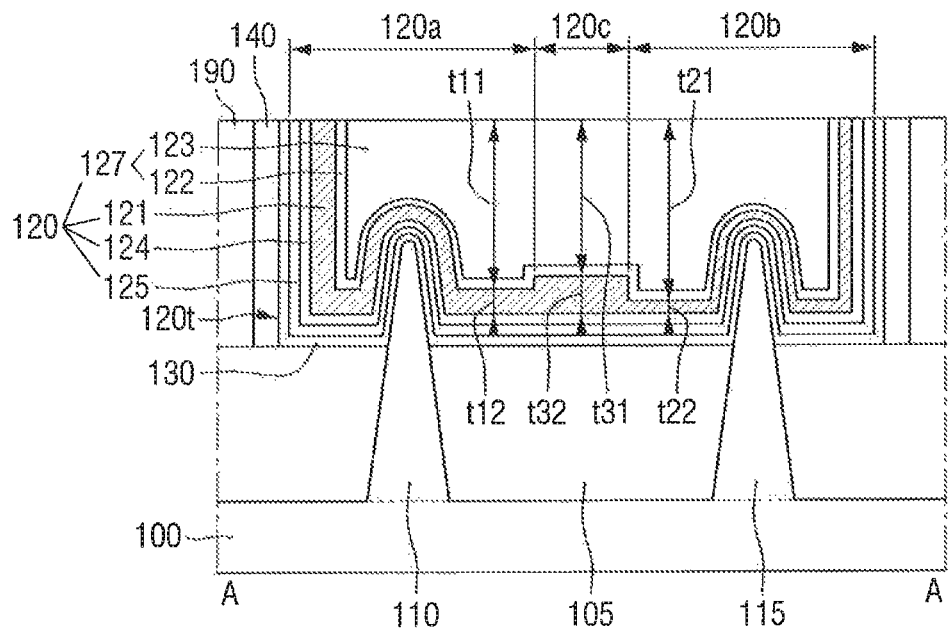
FIG. 15 is a cross sectional view taken along line A-A of FIG. 14.

FIG. 14 is a top view provided to explain a semiconductor device according to an exemplary embodiment of the inventive concept. FIG. 15 is a cross sectional view taken along line A-A of FIG. 14. For convenience of explanation, the following description will be made based on the differences from the description with respect to FIGS. 1 to 3B.

For reference, because FIG. 15 may be substantially the same as FIG. 2A except for the description of the fin-type pattern, some the overlapping parts will only be briefly described. A first fin-type pattern 110 corresponds to the first active region 10, and a second fin-type pattern 115 corresponds to the second active region 20.

Additionally, FIG. 15 is illustrated in a similar manner as the view of FIG. 2A for convenience of explanation. Accordingly, exemplary embodiments are not limited thereto. FIG. 15 may be also similar to one of FIGS. 2B, 4, 5, and 12.

Referring to FIGS. 14 and 15, the semiconductor device according to an exemplary embodiment of the inventive concept includes the first fin-type pattern 110, the second fin-type pattern 115 adjacent to the first fin-type pattern 110, the first field insulating film 105 located between the first fin-type pattern 110 and the second fin-type pattern 115, and the first gate electrode structure 120 traversing the first fin-type pattern 110, the first field insulating film 105 and the second fin-type pattern 115.

In an embodiment, each fin-type pattern includes a curved upper surface (e.g., concave), where a width of a lower surface of the pattern is wider than the upper surface, thereby forming two curved regions. In an embodiment, each fin-type pattern tapers from the lower surface towards the upper surface. In an embodiment, each of the first work function adjustment film 121, the first insertion film 122, the first filling film 123, the first etch prevention film 124, first lower conductive film 125, and the first gate insulating film 130 include a pair of curved portions that mates with the respective curved regions of the fin-type patterns.

In an embodiment, the first fin-type pattern 110 and the second fin-type pattern 115 protrude from the substrate 100. The first fin-type pattern 110 and the second fin-type pattern 115 may extend longitudinally in the first direction X1, respectively.

For example, the first fin-type pattern 110 may be a region where a PMOS is formed, and the second fin-type pattern 115 may be a region where an NMOS is formed.

The first fin-type pattern 110 and the second fin-type pattern 115 may be portions of the substrate 100, and may include an epitaxial layer grown from the substrate 100.

The first fin-type pattern 110 and the second fin-type pattern 115 may each include an element semiconductor material such as silicon or germanium. Further, the first fin-type pattern 110 and the second fin-type pattern 115 may each include a compound semiconductor such as IV-IV group compound semiconductor or III-V group compound semiconductor.

For example, when the IV-IV group compound semiconductor is used, the first fin-type pattern 110 and the second fin-type pattern 115 may be a binary compound or a ternary compound including two or more of carbon (C), silicon (Si), germanium (Ge) and tin (Sn), or the above compounds doped with the IV group element, respectively.

For example, when the III-V group compound semiconductor is used, the first fin-type pattern 110 and the second fin-type pattern 115 may be one of a binary compound, a ternary compound or a quaternary compound which is formed by a combination of a III group element which may be at least one of aluminum (Al), gallium (Ga), and indium (In), with a V group element which may be one of phosphorus (P), arsenic (As) and antimony (Sb).

In a semiconductor device according to an exemplary embodiment of the inventive concept, the first fin-type pattern 110 and the second fin-type pattern 115 are silicon fin-type patterns.

Because the first field insulating film 105 covers a portion of the sidewall of the first fin-type pattern 110 and a portion of the sidewall of the second fin-type pattern 115, the first fin-type pattern 110 and the second fin-type pattern 115 protrudes upward from the upper surface of the first field insulating film 105 formed on the substrate 100.

The first fin-type pattern 110 and the second fin-type pattern 115 may be defined by the first field insulating film 105. In an embodiment, the first fin-type pattern 110 and the second fin-type pattern 115 are spatially separated, but are adjacent to each other.

In an embodiment, the first field insulating film 105 is disposed between the first fin-type pattern 110 and the second fin-type pattern 115, and directly contacts the first fin-type pattern 110 and the second fin-type pattern 115.

The direct contacting of the first field insulating film 105 to the first fin-type pattern 110 and the second fin-type pattern 115 indicates that the fin-type pattern protruding upward further than the upper surface of the first field insulating film 105 is not interposed between the first fin-type pattern 110 and the second fin-type pattern 115.

Differently from the illustration in FIG. 15, the first field insulating film 105 may additionally include at least one field liner film formed between the first fin-type pattern 110 and the first field insulating film 105 and between the second fin-type pattern 115 and the first field insulating film 105.

The first gate electrode structure 120 traverses the first fin-type pattern 110, the second fin-type pattern 115, and the first field insulating film 105. The first gate electrode structure 120 may extend longitudinally in a second direction Y1.

The first portion 120a of the first gate electrode structure may be formed on the first fin-type pattern 110 and the first field insulating film 105. The first portion 120a of the first gate electrode structure may be formed across the first fin-type pattern 110 and the first field insulating film 105.

The second portion 120b of the first gate electrode structure may be formed on the second fin-type pattern 115 and the first field insulating film 105. The second portion 120b of the first gate electrode structure may be formed across the second fin-type pattern 115 and the first field insulating film 105.

In an embodiment, the first portion 120a of the first gate electrode structure intersects the first fin-type pattern 110. In an embodiment, the second portion 120b of the first gate electrode structure intersects the second fin-type pattern 115.

In an embodiment, the third portion 120c of the first gate electrode structure does not intersect the first fin-type pattern 110 and the second fin-type pattern 115. The third portion 120c of the first gate electrode structure is not formed on the first fin-type pattern 110 and the second fin-type pattern 115.

In an embodiment, the third portion 120c of the first gate electrode structure directly contacts the first portion 120a of the first gate electrode structure and the second portion 120b of the first gate electrode structure on the first field insulating film 105.

The first transistor 10p formed on the intersecting region of the first fin-type pattern 110 and the first gate electrode structure 120 may be a p-type fin-type transistor. The second transistor 10n formed on the intersecting region of the second fin-type pattern 115 and the first gate electrode structure 120 may be an n-type fin-type transistor.

The first trench 120t defined by the first spacer 140 traverses the first fin-type pattern 110, the first field insulating film 105, and the second fin-type pattern 115. In an embodiment, the first trench 120t intersects the first fin-type pattern 110 and the second fin-type pattern 115.

The first gate insulating film 130 may be formed on the first fin-type pattern 110, the second fin-type pattern 115, and the first field insulating film 105.

In an embodiment, the first gate insulating film 130 extended along the bottom surface of the first trench 120t is formed along the upper surface of the first field insulating film 105, the profile of the first fin-type pattern 110, and the profile of the second fin-type pattern 115.

The first gate electrode structure 120 may be formed on the first gate insulating film 130.

The first lower conductive film 125, the first etch prevention film 124, the first work function adjustment film 121, and the first insertion film 122 may be each formed along the profile of the first gate insulating film 130.

In other words, the first lower conductive film 125, the first etch prevention film 124, the first work function adjustment film 121, and the first insertion film 122 may be each extended along the profile of the first fin-type pattern 110, the upper surface of the first field insulating film 105, and the profile of the second fin-type pattern 115.

In an embodiment, the thickness t32 of the first work function adjustment film 121 in the third portion 120c of the first gate electrode structure is greater than the thickness t12 of the first work function adjustment film 121 in the first portion 120a of the first gate electrode structure, and greater than the thickness t22 of the first work function adjustment film 121 in the second portion 120b of the first gate electrode structure.

In an embodiment, the thickness t12 of the first work function adjustment film 121 in the first portion 120a of the first gate electrode structure is greater than the thickness t22 of the first work function adjustment film 121 in the second portion 120b of the first gate electrode structure.

As illustrated in FIG. 15, the thickness of the first work function adjustment film 121 may be measured on the upper surface of the first field insulating film 105 between the first fin-type pattern 110 and the second fin-type pattern 115.

In an embodiment, the thickness t31 of the first upper gate electrode 127 in the third portion 120c of the first gate electrode structure is less than the thickness t11 of the first upper gate electrode 127 in the first portion 120a of the first gate electrode structure, and less than the thickness t21 of the first upper gate electrode 127 in the second portion 120b of the first gate electrode structure.

In an embodiment, the thickness t11 of the first upper gate electrode 127 in the first portion 120a of the first gate electrode structure is less than the thickness t21 of the first upper gate electrode 127 in the second portion 120b of the first gate electrode structure.

In FIG. 15, the thickness of the first upper gate electrode 127 may be measured on the upper surface of the first field insulating film 105 between the first fin-type pattern 110 and the second fin-type pattern 115.

Figure 16:
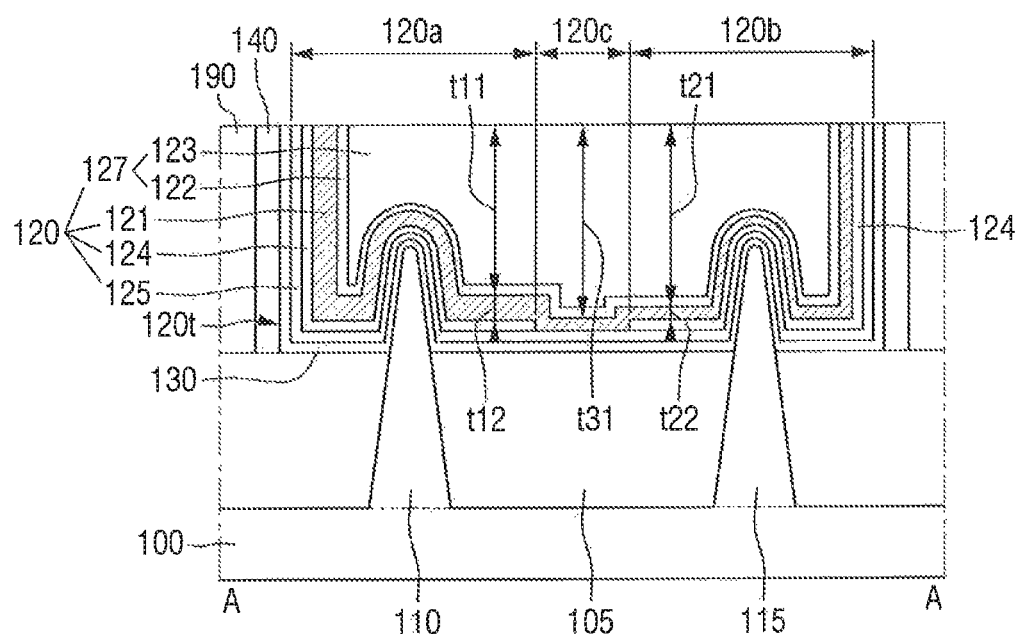
FIG. 16 is a view provided to explain a semiconductor device according to an exemplary embodiment of the inventive concept.

FIG. 16 is a view provided to explain a semiconductor device according to an exemplary embodiment of the inventive concept. For convenience of description, the following description will be made based on the differences from the description with respect to FIGS. 14 and 15.

For reference, because FIG. 16 may be substantially same as FIG. 7 except for the description of the fin-type pattern, the overlapping parts will be briefly explained. Further, a shape of the first etch prevention film 124 of FIG. 16 may be similar to any one of FIG. 8A and FIG. 8B.

Additionally, although FIG. 16 is illustrated similarly to FIG. 7, this is provided merely for convenience of explanation and the exemplary embodiments are not limited thereto. FIG. 16 may be similar to any one of FIG. 9 and FIG. 11.

Referring to FIG. 16, in a semiconductor device according to an exemplary embodiment of the inventive concept, the thickness t31 of the first upper gate electrode 127 in the third portion 120c of the first gate electrode structure is greater than the thickness t11 of the first upper gate electrode 127 in the first portion 120a of the first gate electrode structure.

In an embodiment, the thickness t31 of the first upper gate electrode 127 in the third portion 120c of the first gate electrode structure is greater than the thickness t21 of the first upper gate electrode 127 in the second portion 120b of the first gate electrode structure.

In an embodiment, the thickness t11 of the first upper gate electrode 127 in the first portion 120a of the first gate electrode structure is less than the thickness t21 of the first upper gate electrode 127 in the second portion 120b of the first gate electrode structure.

In an embodiment, the thickness t12 of the first work function adjustment film 121 in the first portion 120a of the first gate electrode structure is greater than the thickness t22 of the first work function adjustment film 121 in the second portion 120b of the first gate electrode structure. In an embodiment, the thickness t12 of the first work function adjustment film 121 on the first fin-type pattern 110 is greater than the thickness t22 of the first work function adjustment film 121 on the second fin-type pattern 115.

Referring to FIGS. 8A and 8B, the first portion 120a, the second portion 120b and the third portion 120c included in the first gate electrode structure 120 may be defined and distinguished by the changes in the thickness of the first etch prevention film 124.

In an embodiment, the first work function adjustment film 121 in the third portion 120c of the first gate electrode structure contacts the first lower conductive film 125.

In an embodiment, the thickness of the first etch prevention film 124 in the third portion 120c of the first gate electrode structure is less than the thickness of the first etch prevention film 124 in the first portion 120a of the first gate electrode structure, and less than the thickness of the first etch prevention film 124 in the second portion 120b of the first gate electrode structure.

Figure 17A:
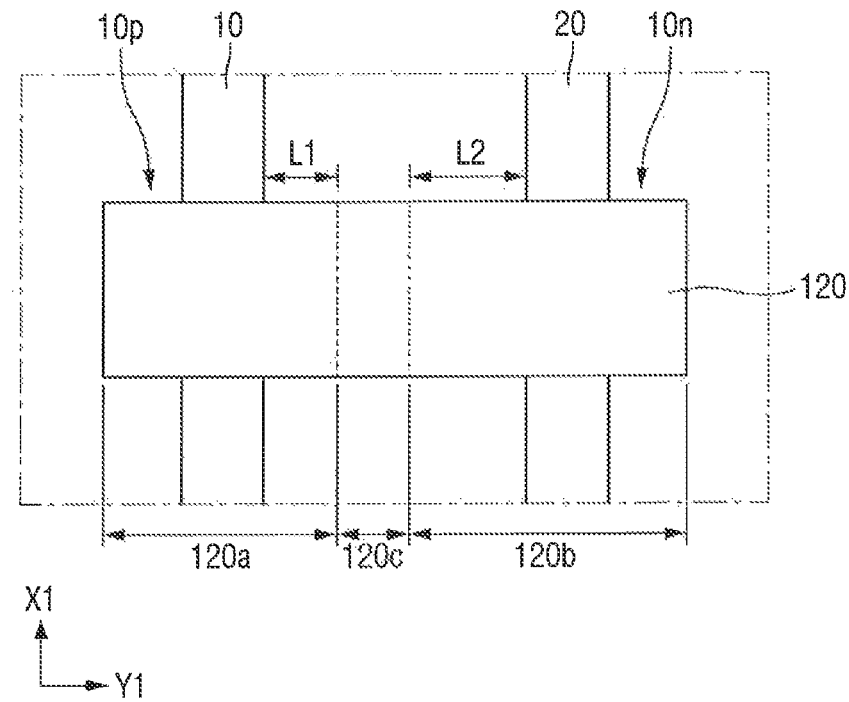
FIGS. 17A and 17B are top views provided to explain a semiconductor device according to an exemplary embodiment of the inventive concept.
Figure 17B:
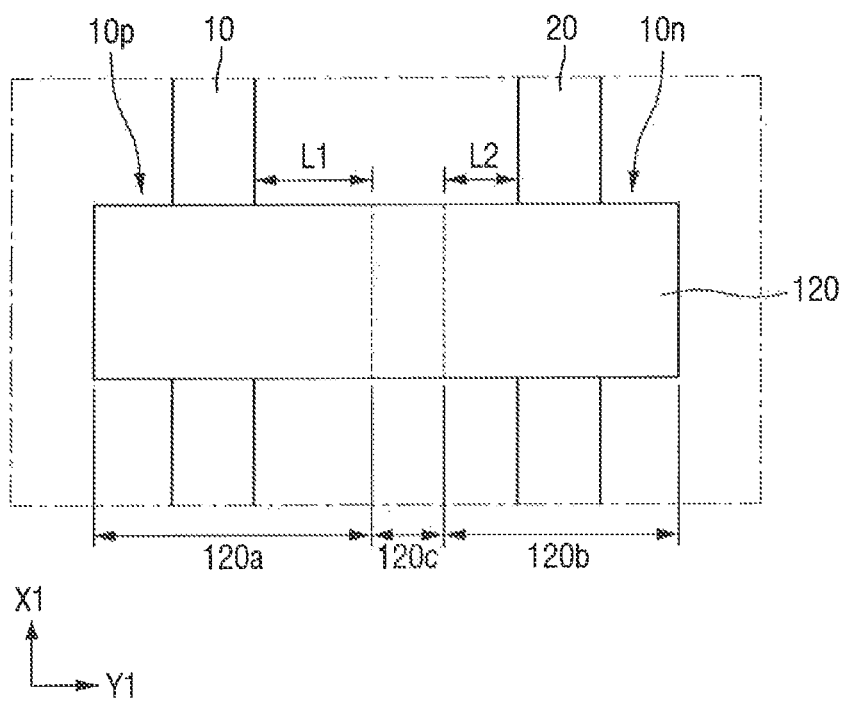

FIGS. 17A and 17B are top views provided to explain a semiconductor device according to an exemplary embodiment of the inventive concept. For convenience of explanation, the following description is provided based on the differences from the description with respect to FIGS. 1 and 3B.

Referring to FIGS. 17A and 17B, in a semiconductor device according to an exemplary embodiment of the inventive concept, a distance L1 between the first active region 10 and the third portion 120c of the first gate electrode structure is different from the distance L2 between the second active region 20 and the third portion 120c of the first gate electrode structure.

As shown in FIG. 17A, in an exemplary embodiment, a center of the third portion 120c of the first gate electrode structure is closer to the first active region 10 than the second active region 20.

Referring to FIG. 17B, in a semiconductor device according to an exemplary embodiment of the inventive concept, the distance L1 between the first active region 10 and the third portion 120c of the first gate electrode structure is greater than the distance L2 between the second active region 20 and the third portion 120c of the first gate electrode structure.

As shown in FIG. 17B, a center of the third portion 120c of the first gate electrode structure may be closer to the second active region 20 than the first active region 10.

Figure 18:
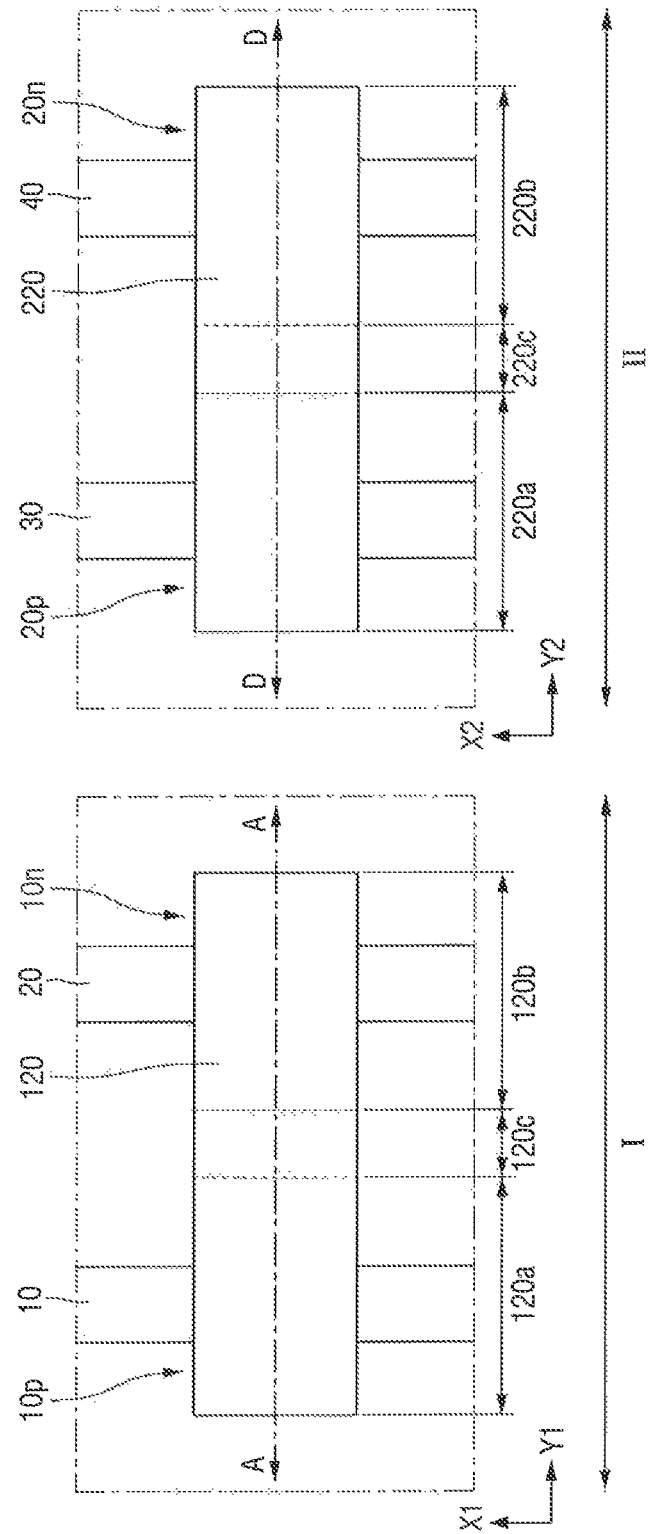
FIG. 18 is a top view provided to explain a semiconductor device according to an exemplary embodiment of the inventive concept.
Figure 19:
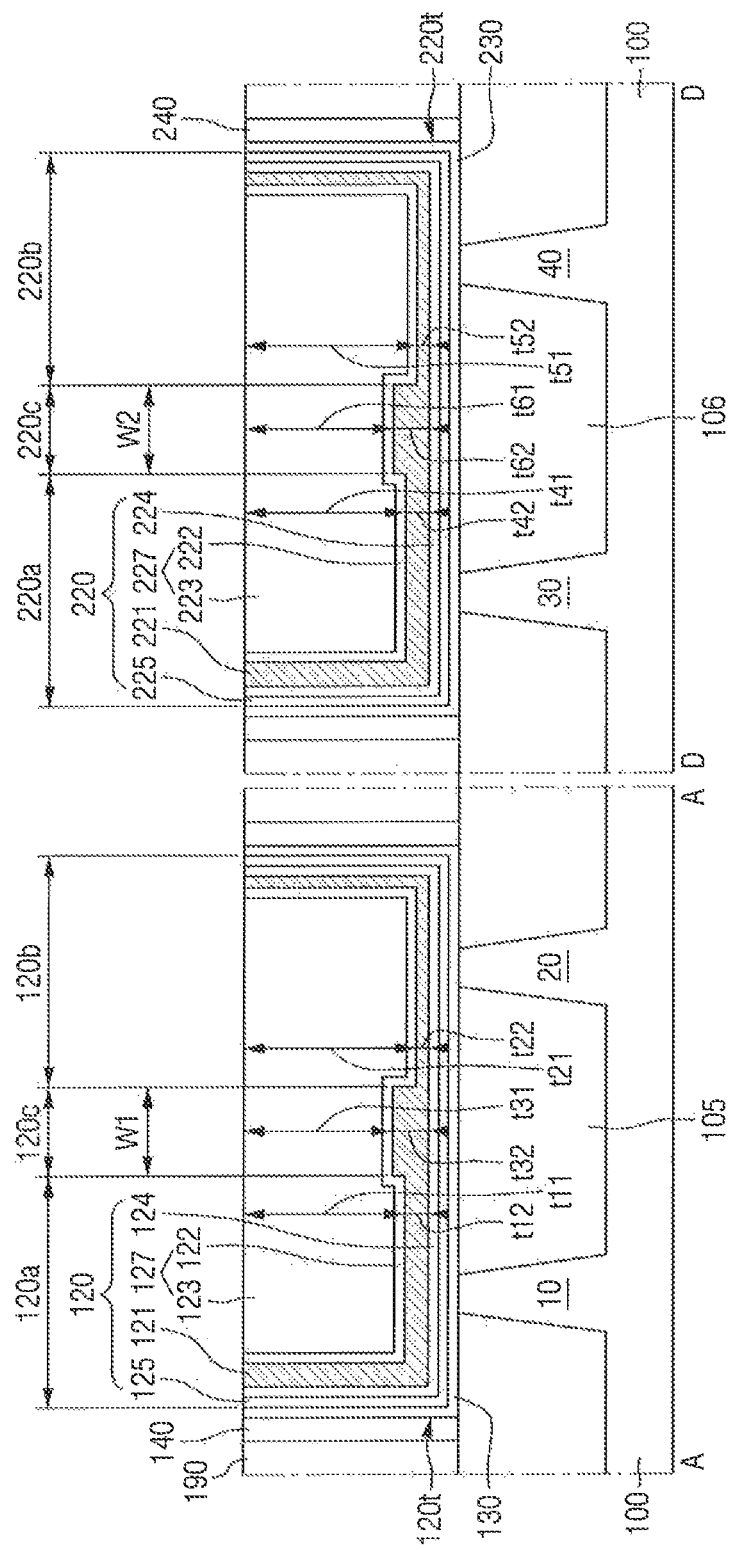
FIG. 19 is a cross sectional view taken along lines A-A and D-D of FIG. 18.

FIG. 18 is a top view provided to explain a semiconductor device according to an exemplary embodiment of the inventive concept. FIG. 19 is a cross sectional view taken along lines A-A and D-D of FIG. 18.

Because the first active region 10, the second active region 20, and the first gate electrode structure 120 illustrated in a first region I of FIGS. 18 and 19 are substantially same as the description with respect to FIGS. 1 to 2B, FIGS. 18 and 19 are explained based on the description illustrated in a second region II.

Referring to FIGS. 18 and 19, the semiconductor device according to an exemplary embodiment of the inventive concept includes the substrate 100 having the first region I and the second region II, the first gate electrode structure 120 formed in the first region I, and the second gate electrode structure 220 formed in the second region II.

The substrate 100 includes the first active region 10, the second active region 20, a third active region 30, a fourth active region 40, the first field insulating film 105, and the second field insulating film 106.

The first region I and the second region II may be one of an SRAM region, a logic region, and an input/output (IO) region, respectively.

The substrate 100 of the first region I includes the first active region 10, the second active region 20, and the first field insulating film 105.

The substrate 100 of the second region II includes the third active region 30, the fourth active region 40, and the second field insulating film 106.

The third active region 30 and the fourth active region 40 are defined by the second field insulating film 106. In an embodiment, the third active region 30 and the fourth active region 40 are spatially separated, and are adjacent to each other.

In an embodiment, the third active region 30 and the fourth active region 40 have a rectangular shape that extends longitudinally in a third direction X2, but is not limited thereto. The third active region 30 and the fourth active region 40 may be adjacent to each other in the long side direction and arranged in parallel.

The same conductive type of the transistors may be formed on the third active region 30 and the fourth active region 40, or transistors of a different conductive type may be formed thereon.

In a semiconductor device according to an exemplary embodiment of the inventive concept, a PMOS is formed in the third active region 30, and an NMOS is formed in the fourth active region 40.

The second field insulating film 106 may be formed to surround the third active region 30 and the fourth active region 40. However, in a semiconductor device according to an exemplary embodiment of the inventive concept shown in FIG. 19, the second field insulating film 106 is illustrated being positioned between the third active region 30 and the fourth active region 40.

The second field insulating film 106 is disposed between the third active region 30 and the fourth active region 40. In an exemplary embodiment, the second field insulating film 106 directly contacts the third active region 30 and the fourth active region 40.

The direct contacting of the second field insulating film 106 to the third active region 30 and the fourth active region 40 indicates that another active region is not interposed between the second field insulating film 106 and the third active region 30 and between the second field insulating film 106 and the fourth active region 40.

The second field insulating film 106 may include, for example, at least one of an oxide film, a nitride film, an oxynitride film, or a combination thereof.

Further, the second field insulating film 106 may additionally include at least one field liner film formed between the third active region 30 and the second field insulating film 106 and between the fourth active region 40 and the second field insulating film 106.

The first gate electrode structure 120 may be formed on the substrate 100 of the first region I. The second gate electrode structure 220 may be formed on the substrate 100 of the second region II.

In an embodiment, the second gate electrode structure 220 traverses the third active region 30, the fourth active region 40, and the second field insulating film 106. The second gate electrode structure 220 may extend longitudinally in a fourth direction Y2.

The second gate electrode structure 220 includes a first portion 220a, a second portion 220b, and a third portion 220c located between the first portion 220a and the second portion 220b. In an embodiment, the third portion 220c of the second gate electrode structure directly contacts the first portion 220a of the second gate electrode structure and the second portion 220b of the second gate electrode structure.

The first portion 220a of the second gate electrode structure may be a p-type metal gate electrode. The first portion 220a of the second gate electrode structure may be formed on the third active region 30 and the second field insulating film 106. The first portion 220a of the second gate electrode structure may be formed across the third active region 30 and the second field insulating film 106.

The second portion 220b of the second gate electrode structure may be an n-type metal gate electrode. The second portion 220b of the second gate electrode structure may be formed on the fourth active region 40 and the second field insulating film 106. The second portion 220b of the second gate electrode structure may be formed across the fourth active region 40 and the second field insulating film 106.

In an embodiment, the third portion 220c of the second gate electrode structure is a connecting gate electrode that connects the p-type metal gate electrode and the n-type metal gate electrode. Further, the third portion 220c of the second gate electrode structure may be a portion of the p-type metal gate electrode or a portion of the n-type metal gate electrode.

In an embodiment, a third transistor 20p is formed on the intersecting region of the third active region 30 and the second gate electrode structure 220, and a fourth transistor 20n is formed on the intersecting region of the fourth active region 40 and the second gate electrode structure 220.

Since the first portion 220a of the second gate electrode structure extends on the second field insulating film 106, the first portion 220a of the second gate electrode structure may overlap with a portion of the second field insulating film 106 as well as third active region 30.

Since the second portion 220b of the second gate electrode structure extends on the second field insulating film 106, the second portion 220b of the second gate electrode structure may overlap with a portion of the second field insulating film 106 as well as fourth active region 40.

The third portion 220c of the second gate electrode structure does not extend on the third active region 30 and the fourth active region 40. The third portion 220c of the second gate electrode structure does not overlap with the third active region 30 and the fourth active region 40.

In an embodiment, the third portion 220c of the second gate electrode structure contacts the first portion 220a of the second gate electrode structure and the second portion 220b of the second gate electrode structure on the second field insulating film 106.

In an embodiment, the interlayer insulating film 190 includes the first trench 120t formed in the first region I and the second trench 220t included in the second region II.

The second trench 220t traverses the third active region 30, the second field insulating film 106, and the fourth active region 40. In an embodiment, the second trench 220t intersects the third active region 30 and the fourth active region 40. The second trench 220t may extend longitudinally in the fourth direction Y2.

The first spacer 140 formed in the first region I may define the first trench 120t. The second spacer 240 formed in the second region II may define the second trench 220t. The second spacer 240 may be formed on the substrate 100. The second spacer 240 may be formed on the sidewall of the second gate electrode structure 220.

The second gate electrode structure 220 may extend longitudinally in the fourth direction Y2. Accordingly, the second gate electrode structure 220 may include a long side that extends in the fourth direction Y2 and a short side that extends in the third direction X2.

The second spacer 240 may be formed on both of the sidewall including the long side of the second gate electrode structure 220 and the sidewall including the short side of the second gate electrode structure 220, but is not limited thereto.

The function performed by the second spacer 240 may be substantially the same as that of the first spacer 140.

The second gate insulating film 230 may be formed on the substrate 100. The second gate insulating film 230 may be formed on the third active region 30, the fourth active region 40, and the second field insulating film 106.

The second gate insulating film 230 may extend along the sidewall and the bottom surface of the first trench 220t. In an embodiment, the second gate insulating film 230 extended along the bottom surface of the second trench 220t traverses the third active region 30, the second field insulating film 106, and the fourth active region 40.

The second gate electrode structure 220 may be formed on the second gate insulating film 230. The second gate insulating film 230 may be formed between the second gate electrode structure 220 and the substrate 100. The second gate insulating film 230 may be formed on a lower portion of the second gate electrode structure 220.

In an embodiment, the second gate electrode structure 220 fills the second trench 220t. In an embodiment, the upper surface of the second gate electrode structure 220 is located on the same plane as the upper surface of the second spacer 240 and the upper surface of the interlayer insulating film 190.

The second gate electrode structure 220 includes the second lower conductive film 225, the second etch prevention film 224, the second work function adjustment film 221, the second insertion film 222, and the second filling film 223 which are sequentially formed on the second gate insulating film 230.

The second lower conductive film 225 may be formed on the second gate insulating film 230. The second lower conductive film 225 may be formed on the third active region 30, the fourth active region 40, and the second field insulating film 106.

The second lower conductive film 225 may extend along the sidewall and the bottom surface of the second trench 220t. The second lower conductive film 225 may be extended along the profile of the second gate insulating film 230.

In an embodiment, the second lower conductive film 225 extended along the bottom surface of the second trench 220t traverses the third active region 30, the second field insulating film 106 and the fourth active region 40.

The first lower conductive film 125 and the second lower conductive film 225 may include the same material.

The second etch prevention film 224 may be formed on the second lower conductive film 225. The second etch prevention film 224 may be formed on the third active region 30, the fourth active region 40, and the second field insulating film 106.

The second etch prevention film 224 may extend along the sidewall and the bottom surface of the second trench 220t. The second etch prevention film 224 may be extended along the profile of the second lower conductive film 225.

In an embodiment, the second etch prevention film 224 extended along the bottom surface of the second trench 220t traverses the third active region 30, the second field insulating film 106, and the fourth active region 40.

The first etch prevention film 124 and the second etch prevention film 224 may include the same material.

The second work function adjustment film 221 may be formed on the second etch prevention film 224. The second work function adjustment film 221 may be formed on the third active region 30, the fourth active region 40, and the second field insulating film 106.

The second work function adjustment film 221 may be extended along the sidewall and the bottom surface of the second trench 220t. The second work function adjustment film 221 may be extended along the profile of the second etch prevention film 224.

In an embodiment, the second work function adjustment film 221 extended along the bottom surface of the second trench 220t traverses the third active region 30, the second field insulating film 106, and the fourth active region 40.

The second work function adjustment film 221 may include, for example, titanium nitride (TiN).

As illustrated in FIG. 19, a thickness t62 of the second work function adjustment film 221 in the third portion 220c of the second gate electrode structure is greater than a thickness t42 of the second work function adjustment film 221 in the first portion 220a of the second gate electrode structure, and greater than a thickness t52 of the second work function adjustment film 221 in the second portion 220b of the second gate electrode structure.

In an exemplary embodiment, the thickness t42 of the second work function adjustment film 221 in the first portion 220a of the second gate electrode structure is greater than the thickness t52 of the second work function adjustment film 221 in the second portion 220b of the second gate electrode structure. In an embodiment, the thickness t42 of the second work function adjustment film 221 in the third active region 30 is greater than the thickness t52 of the second work function adjustment film 221 in the fourth active region 40.

In FIG. 19, the first portion 220a, the second portion 220b and the third portion 220c included in the second gate electrode structure 220 may be defined and distinguished by the changes in the thickness of the second work function adjustment film 221.

A width of the third portion 120c of the first gate electrode structure is a first width W1, and a width of the third portion 220c of the second gate electrode structure is a second width W2. For example, the width W1 of the third portion 120c of the first gate electrode structure may be different from the width W2 of the third portion 220c of the second gate electrode structure, but is not limited thereto.

The second insertion film 222 may be formed on the second work function adjustment film 221. The second insertion film 222 may be formed on the third active region 30, the fourth active region 40, and the second field insulating film 106.

The second insertion film 222 may be extended along the sidewall and the bottom surface of the second trench 220t. The second insertion film 222 may be extended along the profile of the second work function adjustment film 221.

In an embodiment, the second insertion film 222 extended along the bottom surface of the second trench 220t traverses the third active region 30, the second field insulating film 106, and the fourth active region 40.

The first insertion film 122 and the second insertion film 222 may include the same material.

The second filling film 223 may be formed on the second insertion film 222. The second filling film 223 may be formed on the third active region 30, the fourth active region 40, and the second field insulating film 106.

The first filling film 123 and the second filling film 223 may include the same material.

The second insertion film 222 and the second filling film 223 on the second work function adjustment film 221 may form the second upper gate electrode 227.

A thickness t41 of the second upper gate electrode 227 in the first portion 220a of the second gate electrode structure may be different from a thickness t61 of the second upper gate electrode 227 in the third portion 220c of the second gate electrode structure.

A thickness t51 of the second upper gate electrode 227 in the second portion 220b of the second gate electrode structure may be different from the thickness t61 of the second upper gate electrode 227 in the third portion 220c of the second gate electrode structure.

Additionally, the thickness t41 of the second upper gate electrode 227 in the first portion 220a of the second gate electrode structure may be different from the thickness t51 of the second upper gate electrode 227 in the second portion 220b of the second gate electrode structure.

In FIG. 19, in an exemplary embodiment, the thickness t61 of the second upper gate electrode 227 in the third portion 220c of the second gate electrode structure is less than the thickness t41 of the second upper gate electrode 227 in the first portion 220a of the second gate electrode structure, and less than the thickness t51 of the second upper gate electrode 227 in the second portion 220b of the second gate electrode structure.

In an embodiment, the thickness t41 of the second upper gate electrode 227 in the first portion 220a of the second gate electrode structure is less than the thickness t51 of the second upper gate electrode 227 in the second portion 220b of the second gate electrode structure.

In FIG. 19, the cross sectional view taken along lines A-A and D-D of FIG. 18 is illustrated similarly to FIG. 2A, but is not limited thereto. The cross sectional view taken on lines A-A and D-D of FIG. 18 may be similar to any one of FIGS. 2A, 2B, 4, and 12.

Further, the cross sectional view taken along lines A-A and D-D of FIG. 18 may be similar to FIG. 5, respectively.

Additionally, referring to FIGS. 18 and 19, the first to fourth active regions 10, 20, 30, 40 may be the fin-type patterns, respectively.

Figure 20:
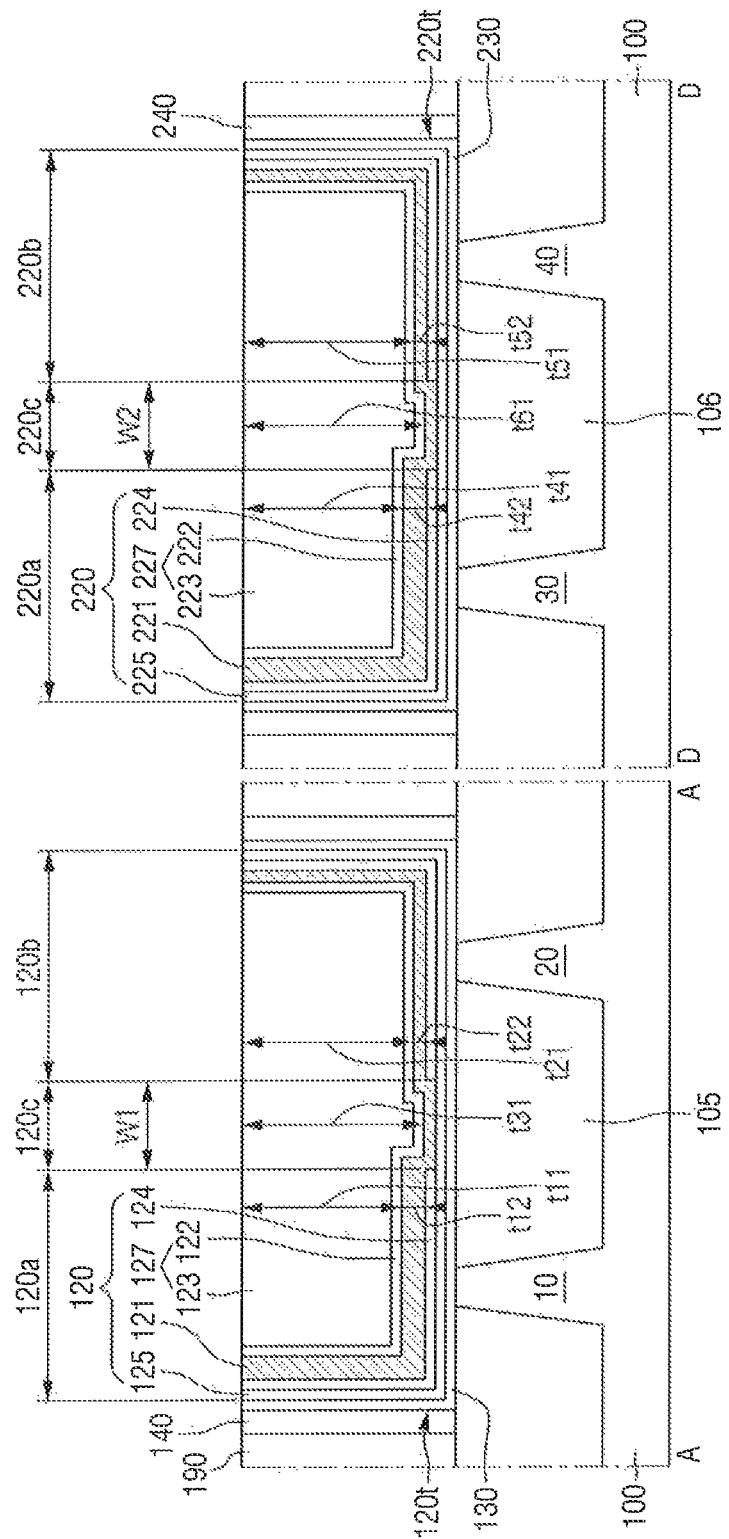
FIG. 20 is a view provided to explain a semiconductor device according to an exemplary embodiment of the inventive concept.

FIG. 20 is a view provided to explain a semiconductor device according to an exemplary embodiment of the inventive concept. For convenience of explanation, differences from the exemplary embodiments explained above with reference to FIGS. 18 and 19 will be mainly explained below.

For example, shapes of the first etch prevention film 124 and the second etch prevention film 224 of FIG. 20 may be similar to any one of FIGS. 8A and 8B, respectively.

Referring to FIG. 20, in a semiconductor device according to an exemplary embodiment of the inventive concept, a thickness t31 of the first upper gate electrode 127 in the third portion 120c of the first gate electrode structure is greater than a thickness t11 of the first upper gate electrode 127 in the first portion 120a of the first gate electrode structure.

In an embodiment, the thickness t31 of the first upper gate electrode 127 in the third portion 120c of the first gate electrode structure is greater than a thickness t21 of the first upper gate electrode 127 in the second portion 120b of the first gate electrode structure.

In an embodiment, the thickness t11 of the first upper gate electrode 127 in the first portion 120a of the first gate electrode structure is less than the thickness t21 of the first upper gate electrode 127 in the second portion 120b of the first gate electrode structure.

In an embodiment, the thickness t12 of the first work function adjustment film 121 in the first portion 120a of the first gate electrode structure is greater than the thickness t22 of the first work function adjustment film 121 in the second portion 120b of the first gate electrode structure.

In an embodiment, the thickness of the first work function adjustment film 121 in the third portion 120c of the first gate electrode structure is the same as or substantially equal to the thickness t22 of the first work function adjustment film 121 in the second portion 120b of the first gate electrode structure, but is not limited thereto.

In an embodiment, the thickness t61 of the second upper gate electrode 227 in the third portion 220c of the second gate electrode structure is greater than the thickness t41 of the second upper gate electrode 227 in the first portion 220a of the second gate electrode structure.

In an embodiment, the thickness t61 of the second upper gate electrode 227 in the third portion 220c of the second gate electrode structure is greater than the thickness t51 of the second upper gate electrode 227 in the second portion 220b of the second gate electrode structure.

In an embodiment, the thickness t41 of the second upper gate electrode 227 in the first portion 220a of the second gate electrode structure is less than the thickness t51 of the second upper gate electrode 227 in the second portion 220b of the second gate electrode structure.

In an embodiment, the thickness t42 of the second work function adjustment film 221 in the first portion 220a of the second gate electrode structure is greater than the thickness t52 of the second work function adjustment film 221 in the second portion 220b of the second gate electrode structure.

In an embodiment, the thickness of the second work function adjustment film 221 in the third portion 220c of the second gate electrode structure is the same as or substantially the same as the thickness t52 of the second work function adjustment film 221 in the second portion 220b of the second gate electrode structure, but not limited thereto.

Referring to FIGS. 8A and 8B, the first portion 120a, the second portion 120b and the third portion 120c included in the first gate electrode structure 120 may be defined and distinguished by the changes in the thickness of the first etch prevention film 124. Further, the first portion 220a, the second portion 220b, and the third portion 220c included in the second gate electrode structure may be defined and distinguished by the changes in the thickness of the second etch prevention film 224.

The width W1 of the third portion 120c of the first gate electrode structure may be different from the width W2 of the third portion 220c of the second gate electrode structure, but not limited thereto.

Referring to FIG. 20, the cross sectional view taken along lines A-A and D-D of FIG. 18 is illustrated to be similar to FIG. 7, but is not limited thereto. The cross sectional view taken along lines A-A and D-D of FIG. 18 may be similar to any one of FIGS. 7, 9, and 11, respectively.

Figure 21:
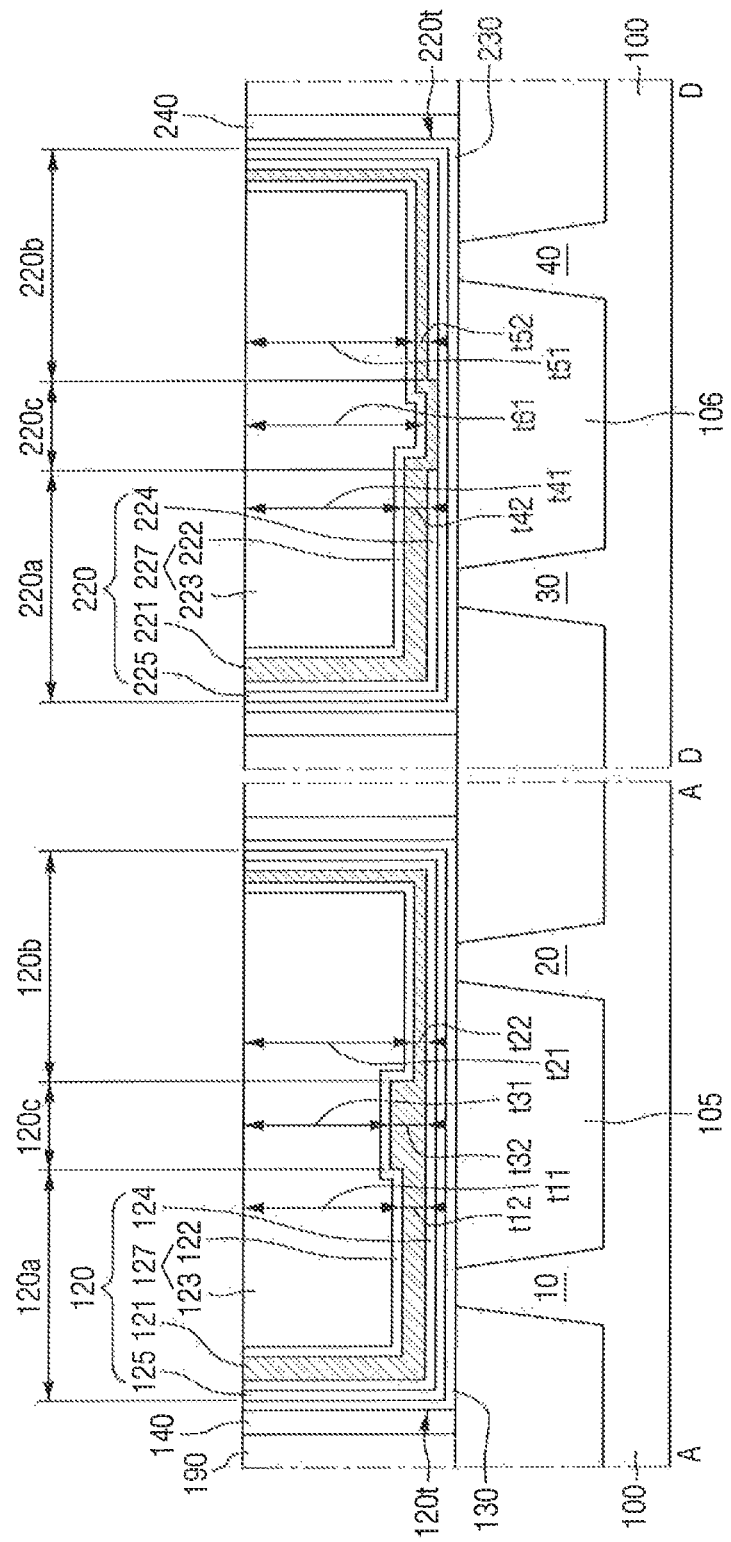
FIG. 21 is a view provided to explain a semiconductor device according to an exemplary embodiment of the inventive concept.

FIG. 21 is a view provided to explain a semiconductor device according to an exemplary embodiment of the inventive concept. For convenience of explanation, differences from the exemplary embodiments explained above with reference to FIGS. 18 and 19 will be mainly explained below.

For example, a shape of the second etch prevention film 224 of FIG. 21 may be similar to any one of FIGS. 8A and 8B, respectively.

Referring to FIG. 21, in an exemplary embodiment, the thickness t61 of the second upper gate electrode 227 in the third portion 220c of the second gate electrode structure is greater than the thickness t41 of the second upper gate electrode 227 in the first portion 220a of the second gate electrode structure.

In an exemplary embodiment, the thickness t61 of the second upper gate electrode 227 in the third portion 220c of the second gate electrode structure is greater than the thickness t51 of the second upper gate electrode 227 in the second portion 220b of the second gate electrode structure.

In FIG. 21, the cross sectional view taken along lines A-A and D-D of FIG. 18 is illustrated to be similar to FIG. 7, but is not limited thereto. The cross sectional view taken along lines A-A and D-D of FIG. 18 may be similar to any one of FIGS. 7, 9, and 11, respectively.

Figure 22:
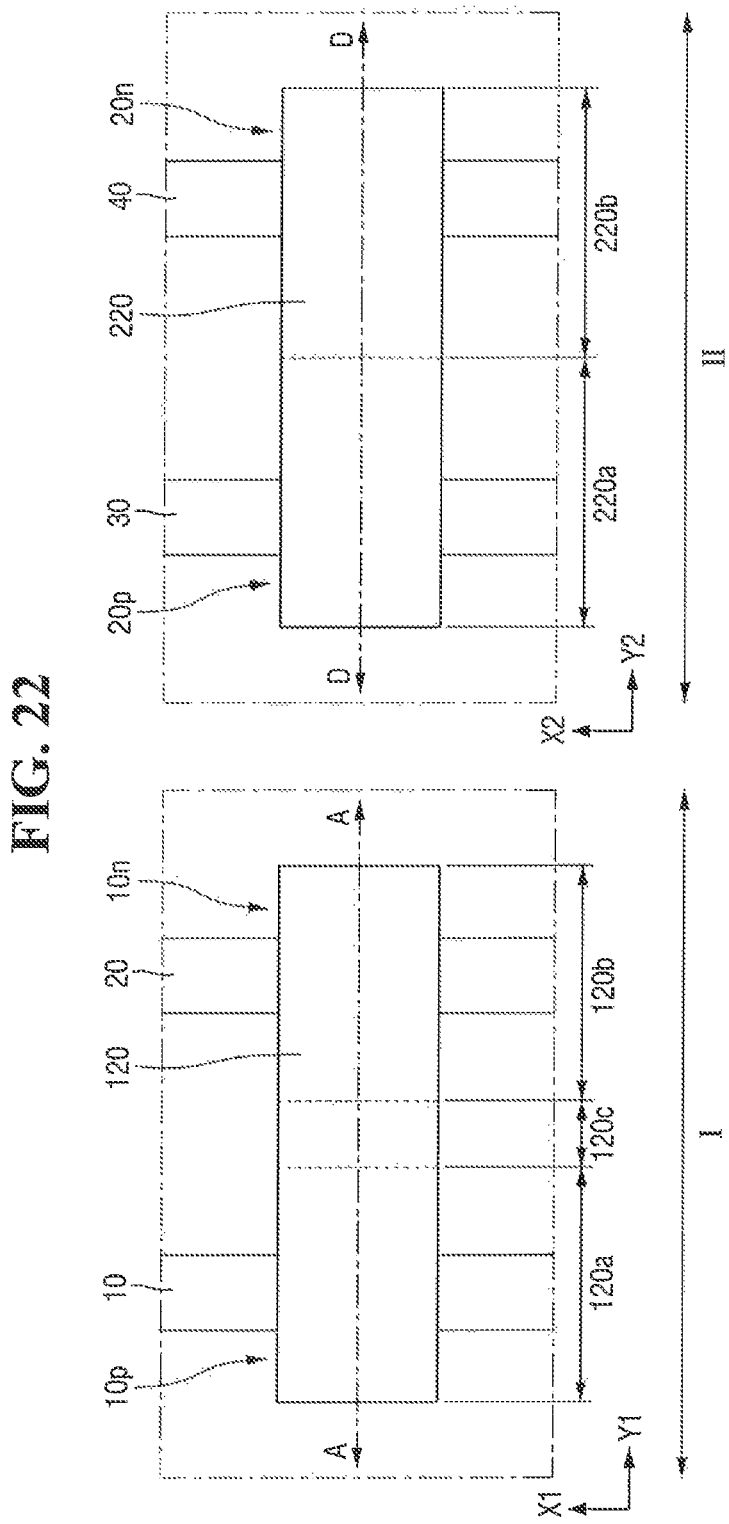
FIG. 22 is a top view provided to explain a semiconductor device according to an exemplary embodiment of the inventive concept.
Figure 23:
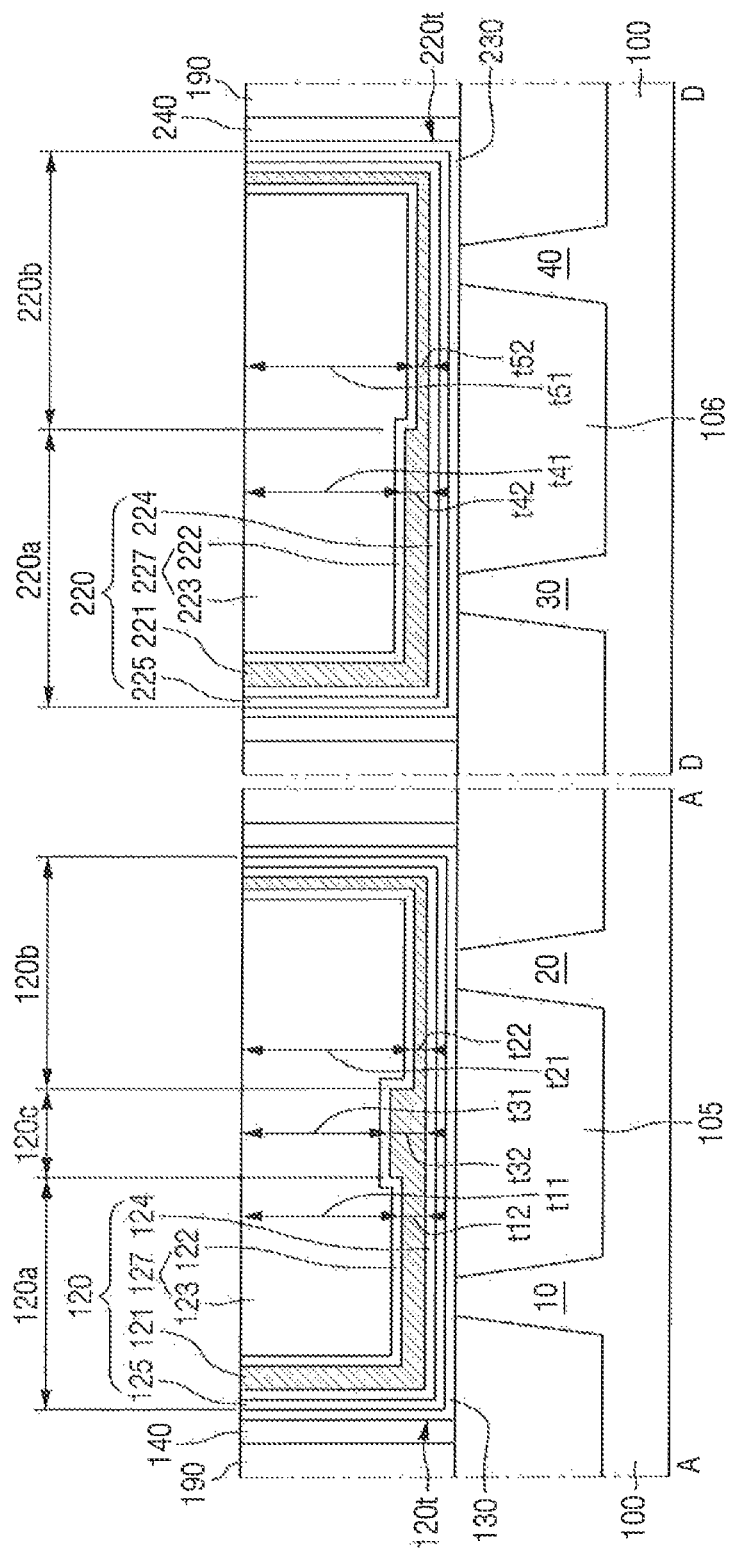
FIG. 23 is a cross sectional view taken along lines A-A and D-D of FIG. 22.

FIG. 22 is a top view provided to explain a semiconductor device according to an exemplary embodiment of the inventive concept. FIG. 23 is a cross sectional view taken along lines A-A and D-D of FIG. 22. For convenience of explanation, differences from the exemplary embodiments explained above with reference to FIGS. 18 and 19 will be mainly explained below.

Referring to FIGS. 22 and 23, in a semiconductor device according to an exemplary embodiment of the inventive concept, the first portion 220a of the second gate electrode structure and the second portion 220b of the second gate electrode structure directly contact each other.

In an embodiment, the thickness of the second work function adjustment film 221 between the third active region 30 and the fourth active region 40 is maintained at a certain value, is then decreased, and is then maintained at the certain value. That is, the thickness of the second work function adjustment film 221 between the third active region 30 and the fourth active region 40 is maintained at a thickness t42, is then changed to thickness t52, and is then maintained at thickness t52.

In other words, the second work function adjustment film 221 between the third active region 30 and the fourth active region 40 may exclude a portion that is greater than the thickness t42 of the second work function adjustment film 221 on the third active region 30 and the thickness t52 of the second work function adjustment film 221 on the fourth active region 40.

Figure 24:
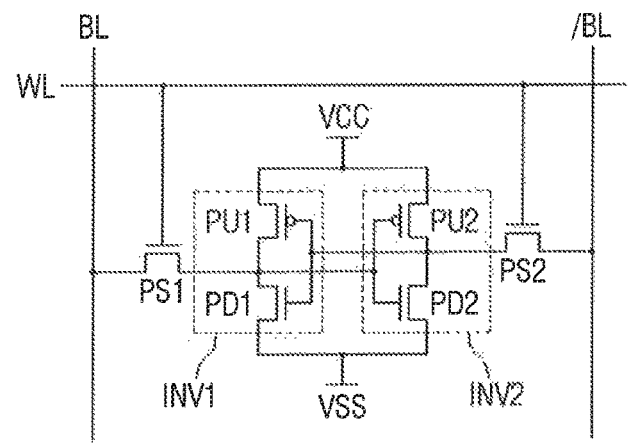
FIGS. 24 and 25 are a circuit view and a layout view provided to explain a semiconductor device according to an exemplary embodiment of the inventive concept.
Figure 25:
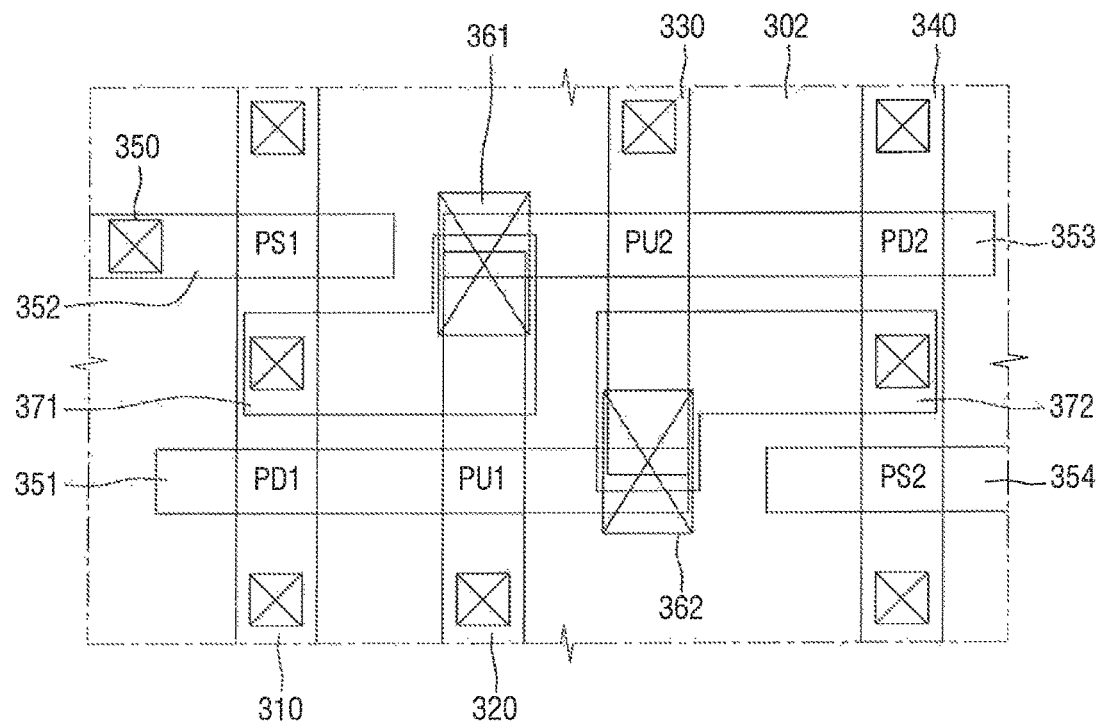

FIGS. 24 and 25 are a circuit view and a layout view provided to explain a semiconductor device according to an exemplary embodiment of the inventive concept.

Referring to FIGS. 24 and 25, a semiconductor device according to an exemplary embodiment of the inventive concept includes a pair of inverters INV1 and INV2 connected to each other in parallel between a power supply node Vcc and a ground node Vss, and a first pass transistor PS1 and a second pass transistor PS2 respectively connected to output nodes of the inverters INV1 and INV2. The first pass transistor PS1 and the second pass transistor PS2 are connected to a bit line BL and a complementary bit line/BL, respectively. The gates of the first pass transistor PS1 and the second pass transistor PS2 are connected to a word line WL.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first pull-up transistor PU1 and the second pull-up transistor PU2 may be PMOS transistors, and the first pull-down transistor PD1 and the second pull-down transistor PD2 may be NMOS transistors.

The first inverter INV1 and the second inverter INV2 comprise one latch circuit, since the input node of the first inverter INV1 is connected to the output node of the second inverter INV2, and the input node of the second inverter INV2 is connected to the output node of the first inverter INV1.

Referring to FIGS. 24 and 25, a fifth active region 310, a sixth active region 320, a seventh active region 330, and an eighth active region 340, which are separated from each other, are formed to extend longitudinally in one direction (e.g., vertical direction of FIG. 25). The sixth active region 320 and the seventh active region 330 may extend shorter than the fifth active region 310 and the eighth active region 340. For example, as shown in FIG. 25, the length of the sixth active region 320 and the seventh active region 330 may be shorter than the length of the fifth active region 310 in the vertical direction.

Further, a first conductive line 351, a second conductive line 352, a third conductive line 353 and a fourth conductive line 354 may extend longitudinally in another direction (e.g., horizontal direction of FIG. 25) and intersect the fifth to eighth active regions 310 to 340. Specifically, the first conductive line 351 may entirely intersect the fifth active region 310 and the sixth active region 320, and may partially overlap with an end of the seventh active region 330. The third conductive line 353 may entirely intersect the eighth active region 340 and the seventh active region 330 and may partially overlap with an end of the sixth active region 320. The second conductive line 352 and the fourth conductive line 354 intersect the fifth active region 310 and the eighth active region 340, respectively.

As shown in the drawings, the first pull-up transistor PU1 may be defined near an intersecting region of the first conductive line 351 and the sixth active region 320, the first pull-down transistor PD1 may be defined near an intersecting region of the first conductive line 351 and the fifth active region 310, and the first pass transistor PS1 may be defined near an intersecting region of the second conductive line 352 and the fifth active region 310. The second pull-up transistor PU2 may be defined near an intersecting region of the third conductive line 353 and the seventh active region 330, the second pull-down transistor PD2 may be defined near an intersecting region of the third conductive line 353 and the eighth active region 340, and the second pass transistor PS2 may be defined near an intersecting region of the fourth conductive line 354 and the eighth active region 340.

Although not shown, sources/drains may be formed on both sides of the intersecting regions of the first to fourth conductive lines 351 to 354 and the fifth to eighth active regions 310, 320, 330 and 340.

Further, a plurality of contacts 350 may be formed. For example, the contacts 350 may be made of a conductive material that connects to one or more of the conductive lines.

In an exemplary embodiment, a shared contact 361 connects the sixth active region 320, the third conductive line 353 and a wiring 371 simultaneously. The shared contact 362 may connect the seventh active region 330, the first conductive line 351 and the wiring 372 simultaneously.

For example, the first conductive line 351 and the third conductive line 353 may correspond to the first gate electrode structure 120 in FIGS. 1 to 17B, the sixth active region 320 and the seventh active region 330 may correspond to the first active region 10 and the first fin-type pattern 110 in FIGS. 1 to 17B, and the fifth active region 310 and the eighth active region 340 may correspond to the second active region 20 and the second fin-type pattern 115 in FIGS. 1 to 17B.

FIGS. 26 to 33 are views illustrating intermediate stages of fabrication, provided to explain a method for fabricating a semiconductor device according to an exemplary embodiment of the inventive concept.

FIGS. 26 to 33 are cross sectional views taken along line A-A of FIG. 1.

Figure 26:
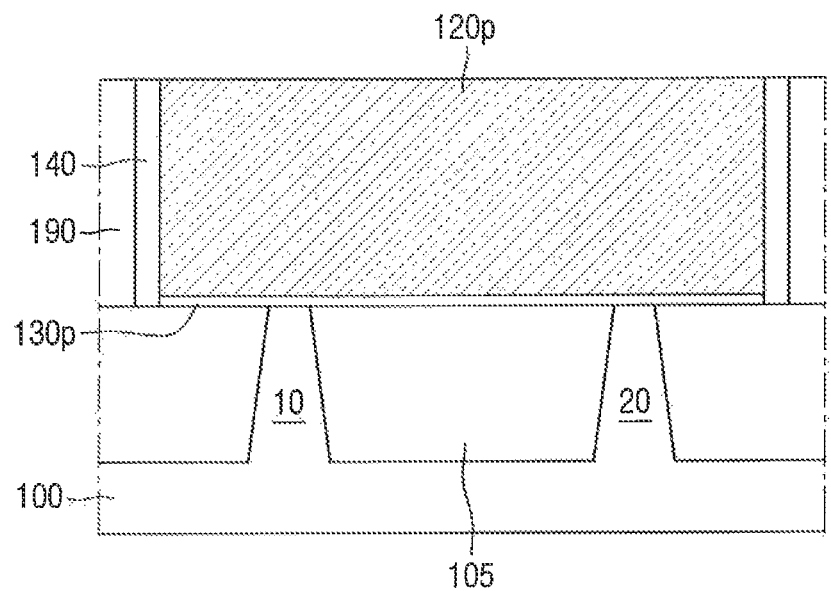
FIGS. 26 to 33 are intermediate stages of fabrication, provided to explain a method for fabricating a semiconductor device according to an exemplary embodiment of the inventive concept.

Referring to FIG. 26, a substrate 100 including the first active region 10, the second active region 20 and the first field insulating film 105 is provided.

A dummy gate insulating film 130p and a dummy gate electrode 120p, which traverse the first active region 10, the first field insulating film 105 and the second active region 20, are formed on the substrate 100.

The dummy gate insulating film 130p may include, for example, one of silicon oxide (SiO$_2$), silicon oxynitride (SiON), and a combination thereof. The dummy gate electrode 120p may be, for example, silicon. For example, the dummy gate electrode 120p may include one of polycrystalline silicon (poly Si), amorphous silicon (a-Si), and a combination thereof.

The first spacer 140 is formed on the sidewall of the dummy gate electrode 120p. Although not illustrated, a source/drain may be formed in the first active region 10 and the second active region 20 after the first spacer 140 is formed. For example, a drain could be formed in the first active region 10 and a source could be formed in the second active region 20.

Thereafter, an interlayer insulating film 190 covering the dummy gate electrode 120p is formed on the substrate 100.

Thereafter, the upper surface of the dummy gate electrode 120p is exposed. For example, the upper surface may be exposed by planarizing the interlayer insulating film 190. The planarizing may be performed by chemical mechanical planarization.

Figure 27:
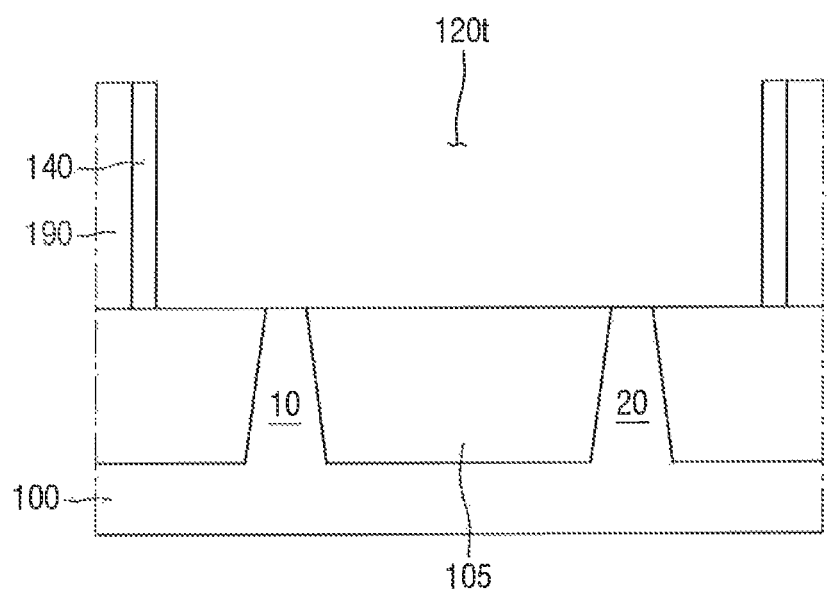

Referring to FIG. 27, the dummy gate electrode 120p and the dummy gate insulating film 130p are removed.

Through the above process, the first trench 120t traversing the first active region 10, the first field insulating film 105 and the second active region 20 is formed.

Figure 28:
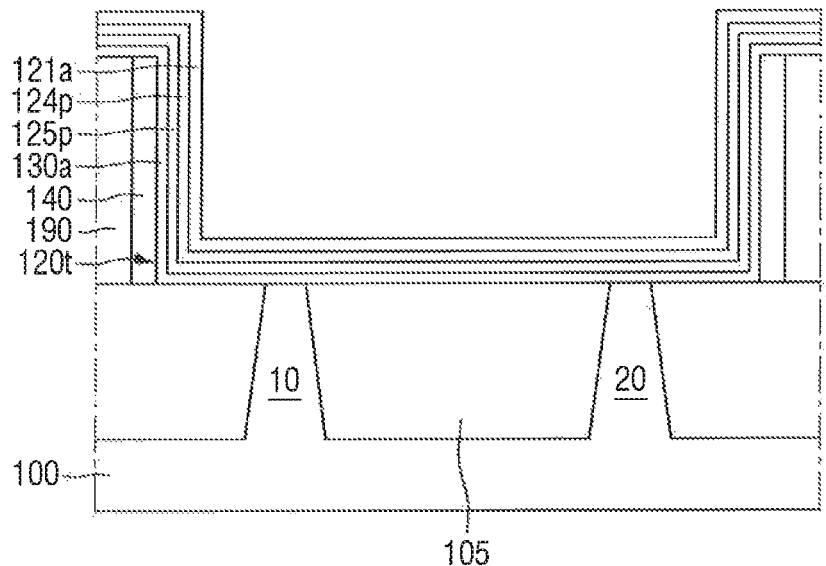

Referring to FIG. 28, a pre-gate insulating film 130a is formed on the substrate 100.

The pre-gate insulating film 130a extends along the sidewall and the bottom surface of the first trench 120t, and along the upper surface of the interlayer insulating film 190.

Thereafter, a pre-lower conductive film 125p and a pre-etch prevention film 124p are formed sequentially on the pre-gate insulating film 130a.

The pre-lower conductive film 125p and the pre-etch prevention film 124p may be respectively extend along the sidewall and the bottom surface of the first trench 120t, and along the upper surface of the interlayer insulating film 190.

Thereafter, the first conductive film 121a is formed on the pre-etch prevention film 124p. The first conductive film 121a extends along the sidewall and the bottom surface of the first trench 120t, and along the upper surface of the interlayer insulating film 190.

The first conductive film 121a may include titanium nitride (TiN), for example.

Figure 29A:
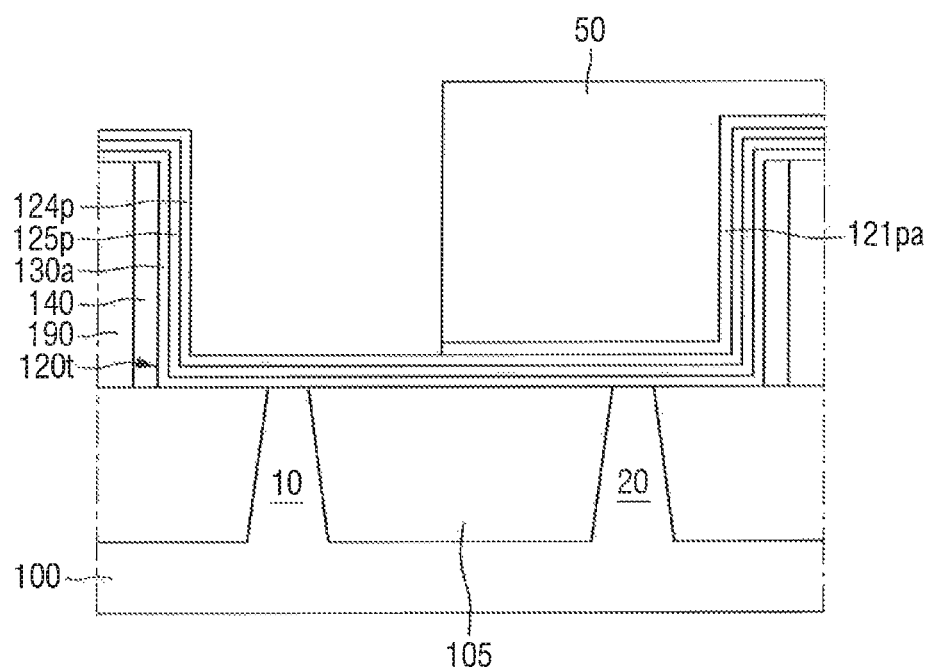
Figure 29B:
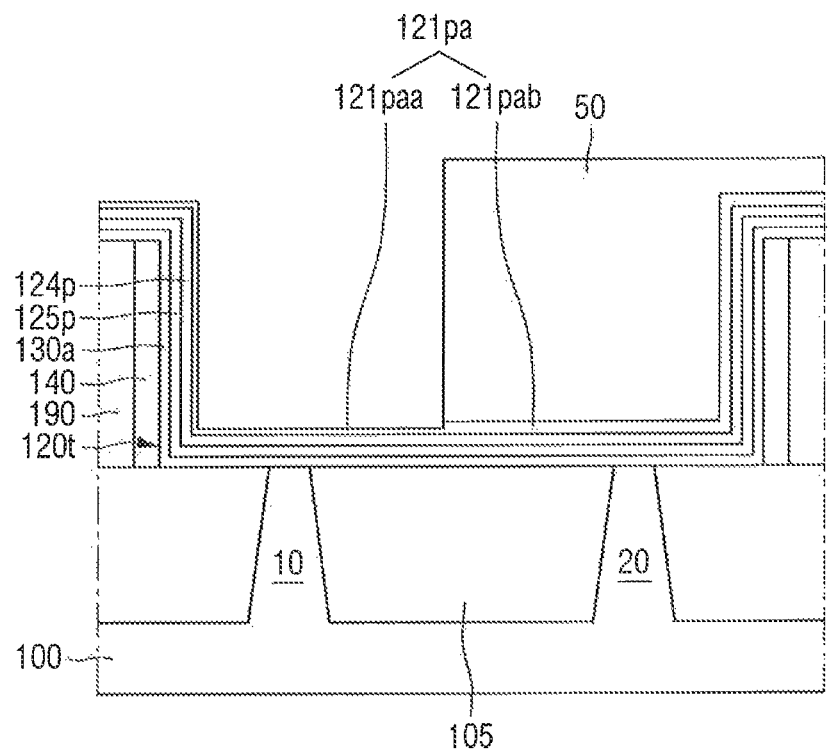

Referring to FIGS. 29A and 29B, a first mask pattern 50 covering a portion of the first conductive film 121a formed on the bottom surface of the first trench 120t is formed within the first trench 120t.

The first mask pattern 50 covers the first conductive film 121a formed on a portion of the second active region 20 and the first field insulating film 105. The first mask pattern 50 does not cover the portion of first conductive film 121a formed on the first active region 10.

Thereafter, a patterned first conductive film 121pa is formed by removing at least a portion of the first conductive film 121a using the first mask pattern 50 as mask.

FIG. 29A illustrates that the portion of the first conductive film 121a which is not covered with the first mask pattern 50 is entirely removed.

Meanwhile, FIG. 29B illustrates that the first conductive film 121a which is not covered with the first mask pattern 50 is partially removed.

Through the above process, the patterned first conductive film 121pa includes the first portion 121paa, and the second portion 121pab which is thicker than the first portion 121paa.

Thereafter, the first mask pattern 50 is removed.

Figure 30:
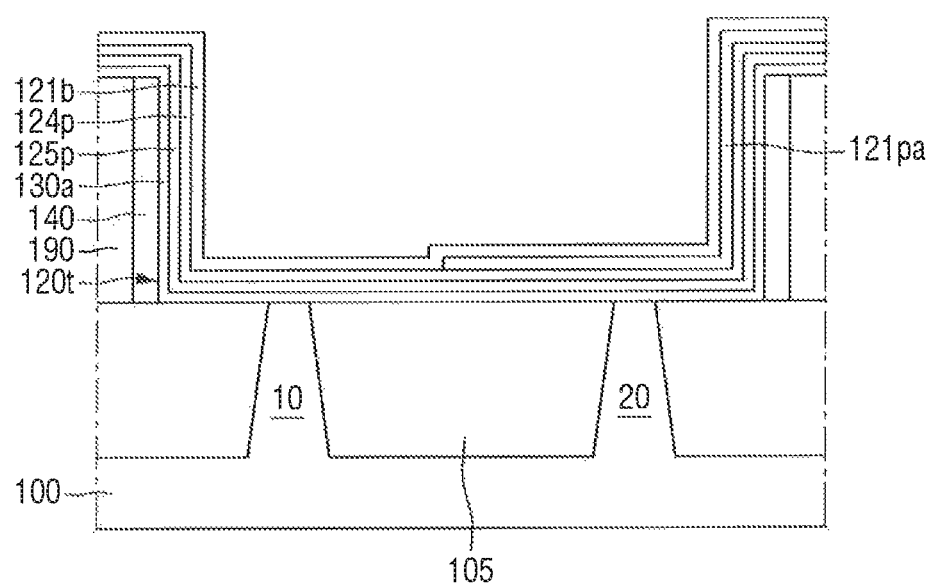
Figure 31:
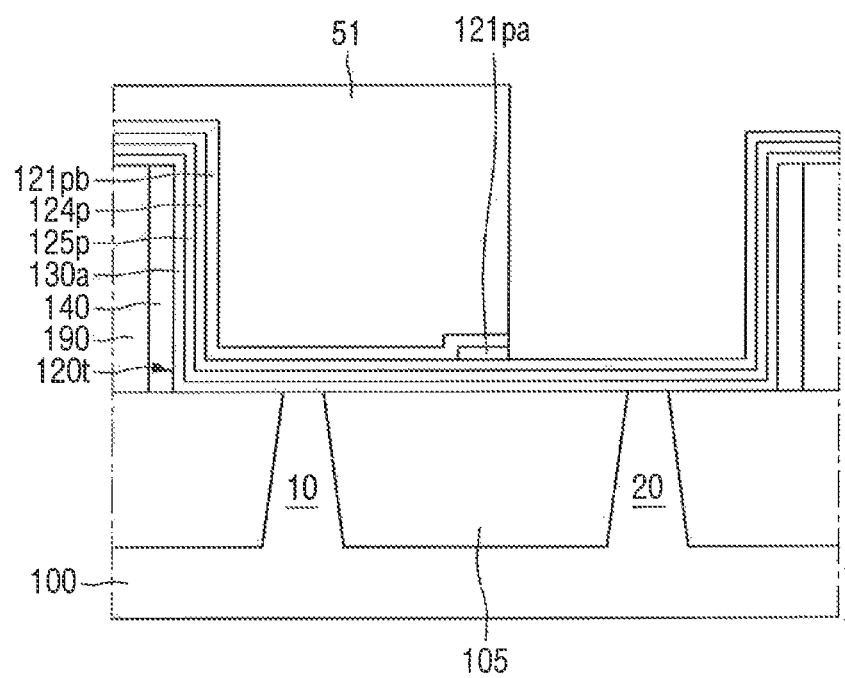

FIGS. 30 and 31 explain a fabricating method processed by using the patterned first conductive film 121pa of FIG. 29A.

Referring to FIG. 30, the second conductive film 121b extended along the sidewall and the bottom surface of the first trench 120t is formed on the patterned first conductive film 121pa.

The second conductive film 121b may include titanium nitride (TiN), for example.

Referring to FIG. 31, the second mask pattern 51 covering a portion of the second conductive film 121b formed on the bottom surface of the first trench 120t is formed within the first trench 120t.

The second mask pattern 51 overlaps with a portion of the patterned first conductive film 121pa formed on the bottom surface of the first trench 120t. In an embodiment, the remainder of the patterned first conductive film 121pa does not overlap with the second mask pattern 51.

Thereafter, the patterned second conductive film 121pb is formed by removing the second conductive film 121b using the second mask pattern 51 as a mask. While the patterned second conductive film 121pb is being formed, the remainder of the patterned first conductive film 121pa which does not overlap with the second mask pattern 51 is also removed.

Thereafter, the second mask pattern 51 is also removed.

Figure 32A:
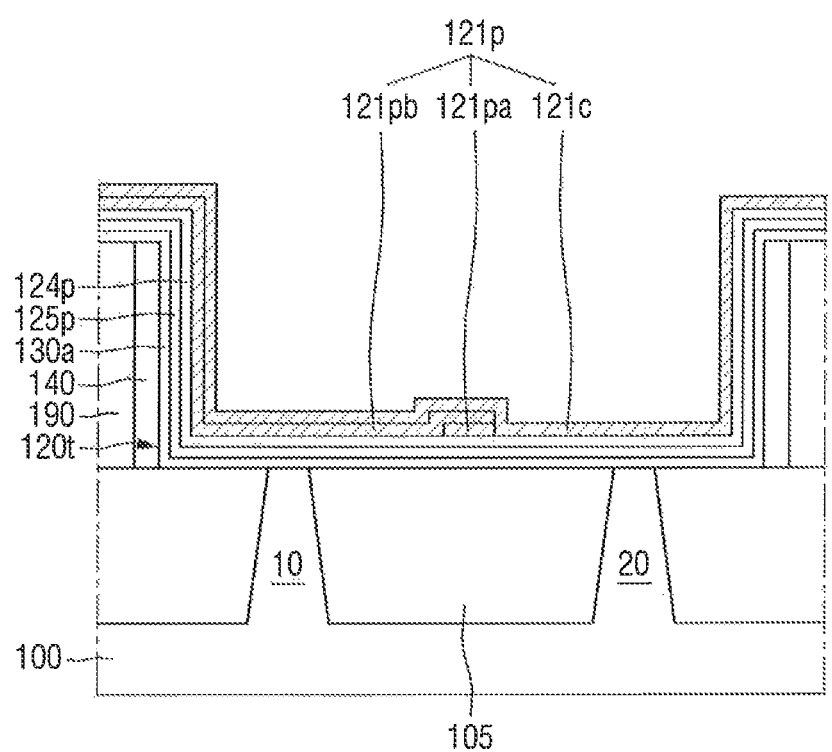
Figure 32B:
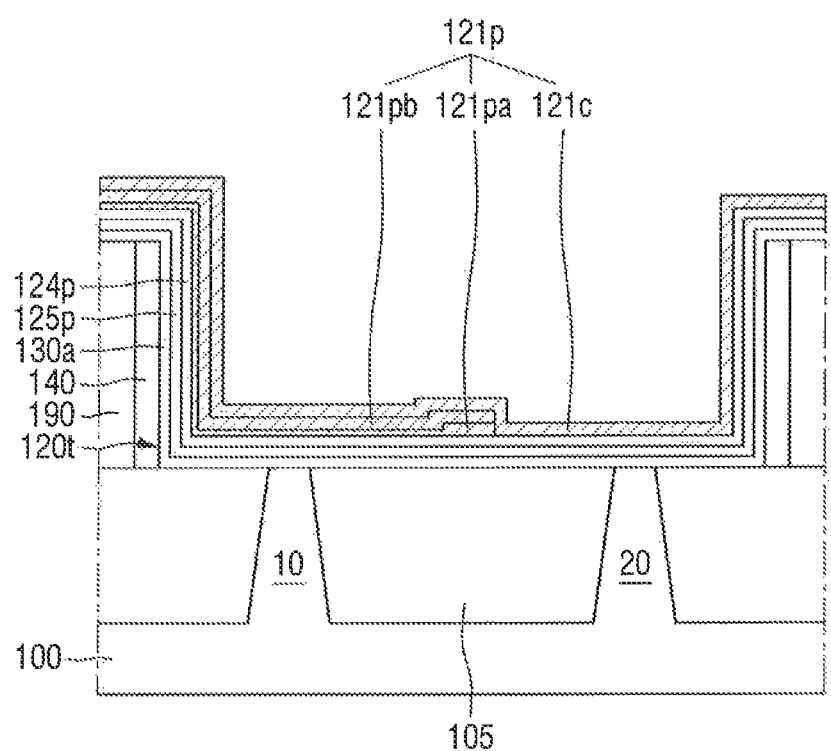

Referring to FIGS. 32A and 32B, the third conductive film 121c is formed on the patterned first conductive film 121pa and the patterned second conductive film 121pb which remains within the first trench 120t.

The third conductive film 121c extends along the sidewall and the bottom surface of the first trench 120t.

The third conductive film 121c may include titanium nitride, for example.

Through the above process, a pre-work function adjustment film 121p that extends along the sidewall and the bottom surface of the first trench 120t is formed. The pre-work function adjustment film 121p includes the patterned first conductive film 121pa, the patterned second conductive film 121pb and the third conductive film 121c.

FIG. 32A illustrates the pre-work function adjustment film 121p manufactured with the patterned first conductive film 121pa of FIG. 29A.

Meanwhile, FIG. 32B illustrates the pre-work function adjustment film 121p manufactured with the patterned first conductive film 121pa of FIG. 29B.

Figure 33:
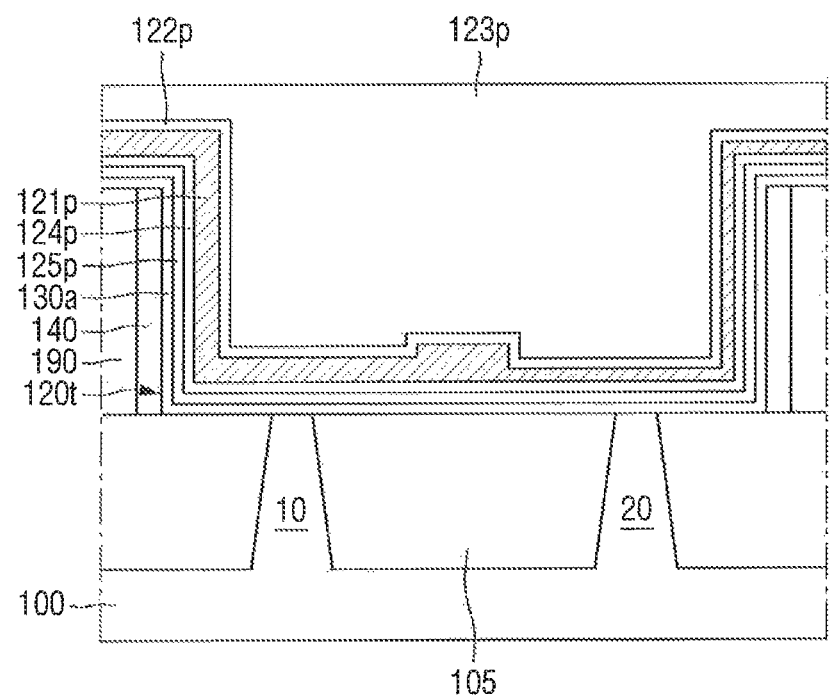

Referring to FIG. 33, a pre-insertion film 122p is formed on the pre-work function adjustment film 121p. The pre-insertion film 122p extends along the sidewall and the bottom surface of the first trench 120t and the upper surface of the interlayer insulating film 190.

Thereafter, a pre-filling film 123p filling the first trench 120t is formed on the pre-insertion film 122p.

Referring to FIG. 2A, the first gate insulating film 130 and the first gate electrode structure 120 are formed by removing the pre-filling film 123p, the pre-insertion film 122p, the pre-work function adjustment film 121p, the pre-etch prevention film 124p, the pre-lower conductive film 125p and the pre-gate insulating film 130a which are formed on the upper surface of the interlayer insulating film 190.

Figure 34:
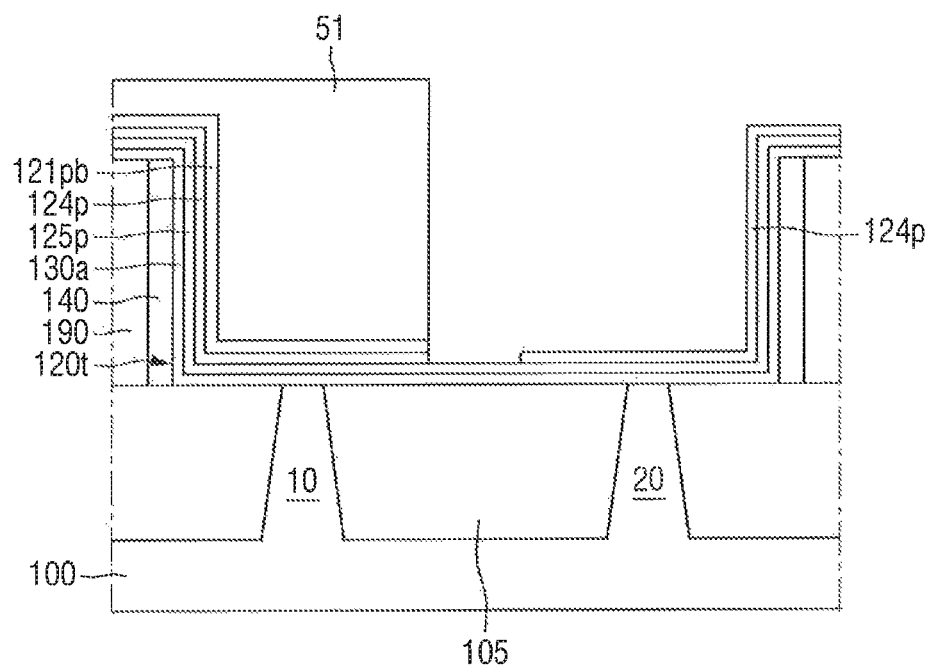
FIGS. 34 and 35 are intermediate stages of fabrication, provided to explain a method for fabricating a semiconductor device according to an exemplary embodiment of the inventive concept.
Figure 35:
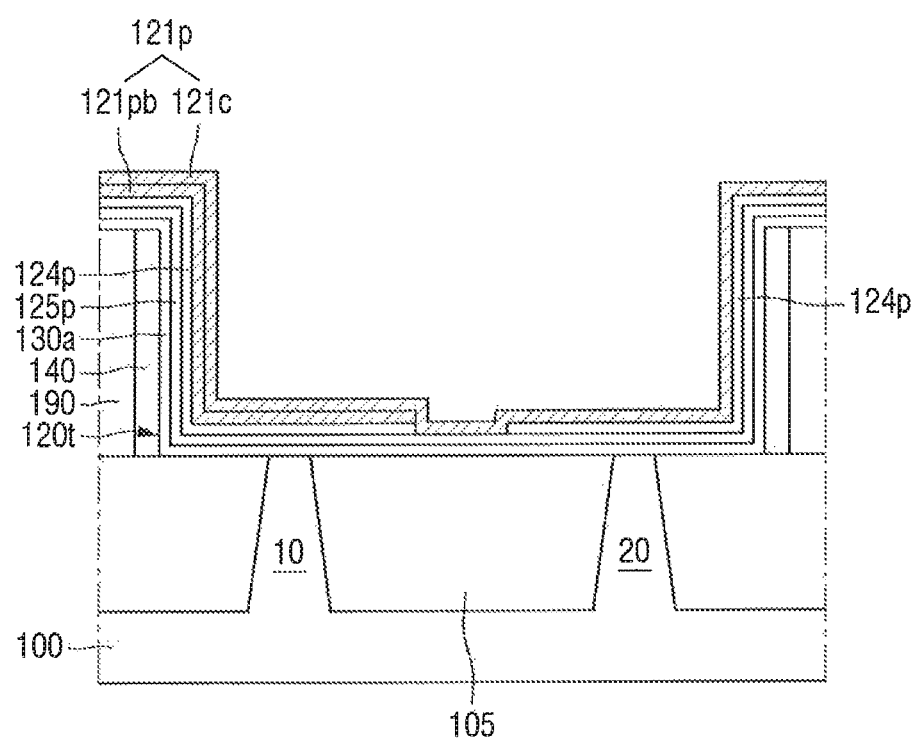

FIGS. 34 and 35 are views illustrating intermediate stages of fabrication, provided to explain a method for fabricating a semiconductor device according to an exemplary embodiment of the inventive concept. FIG. 34 involves a process performed after FIG. 30.

Referring to FIG. 34, the second mask pattern 51 covering a portion of the second conductive film 121b formed on the bottom surface of the first trench 120t is formed within the first trench 120t.

The second mask pattern 51 does not overlap with the patterned first conductive film 121pa formed on the bottom surface of the first trench 120t.

Because the patterned first conductive film 121pa is on a portion which does not overlap with the second mask pattern 51, the portion which does not overlap with the second mask pattern 51 has a portion with only the second conductive film 121b, mixed with a portion having the second conductive film 121b and the patterned first conductive film 121pa.

In an embodiment, the patterned second conductive film 121pb is formed by removing the second conductive film 121b by using the second mask pattern 51 as a mask. While the patterned second conductive film 121pb is being formed, the patterned first conductive film 121pa and the second conductive film 121b which do not overlap with the second mask pattern 51 are removed.

In the above process, because the thickness of the second conductive film 121b and the patterned first conductive film 121pa is thicker than the thickness of the second conductive film 121b, the pre-etch prevention film 124p of the portion that has only the second conductive film 121b is exposed while the second conductive film 121b and the patterned first conductive film 121pa are being removed.

After the pre-etch prevention film 124p is exposed, a portion of the pre-etch prevention film 124p is removed.

Thereafter, the second mask pattern 51 is removed.

Referring to FIG. 35, the third conductive film 121c is formed on the patterned second conductive film 121pb within the first trench 120t.

The third conductive film 121c extends along the sidewall and the bottom surface of the first trench 120t.

The third conductive film 121c may include titanium nitride, for example.

Through the above process, the pre-work function adjustment film 121p extended along the sidewall and the bottom surface of the first trench 120t is formed. The pre-work function adjustment film 121p includes the patterned second conductive film 121pb and the third conductive film 121c.

The foregoing is illustrative of exemplary embodiments of the inventive concept and is not to be construed as limiting thereof. Although a few exemplary embodiments have been described, those skilled in the art will appreciate that many variations and modifications can be made to the exemplary embodiments described herein without substantially departing from the principles of the present inventive concept. Accordingly, all such modifications are intended to be included within the scope of the present inventive concept.

What is claimed is:

1. A semiconductor device, comprising:
   a substrate including a first active region, a second active region, and a field insulating film directly contacting the first active region and the second active region between the first active region and the second active region; and
   a gate electrode structure traversing the first active region, the second active region, and the field insulating film on the substrate,
   wherein the gate electrode structure comprises a first portion positioned across the first active region and the field insulating film, a second portion positioned across the second active region and the field insulating film, and a third portion directly contacting the first portion and the second portion on the field insulating film,
   wherein the gate electrode structure further comprises a gate electrode comprising an insertion film traversing the first active region, the field insulating film and the second active region, and a filling film disposed on the insertion film,
   wherein a thickness of the gate electrode in the third portion of the gate electrode structure is different from a thickness of the gate electrode in the first portion of the gate electrode structure, and
   wherein the thickness of the gate electrode in the third portion of the gate electrode structure is different from a thickness of the gate electrode in the second portion of the gate electrode structure, and
   wherein the thickness of the gate electrode in the first portion of the gate electrode structure is different from the thickness of the gate electrode in the second portion of the gate electrode structure.

2. The semiconductor device of claim 1, wherein the thickness of the gate electrode in the third portion of the gate electrode structure is less than the thickness of the gate electrode in the first portion of the gate electrode structure, and
   wherein the thickness of the gate electrode in the third portion of the gate electrode structure is less than the thickness of the gate electrode in the second portion of the gate electrode structure.

3. The semiconductor device of claim 1, wherein the thickness of the gate electrode in the third portion of the gate electrode structure is greater than the thickness of the gate electrode in the first portion of the gate electrode structure, and
   wherein the thickness of the gate electrode in the third portion of the gate electrode structure is greater than the thickness of the gate electrode in the second portion of the gate electrode structure.

4. The semiconductor device of claim 1, wherein the first active region comprises a channel region of a p-type transistor, and the second active region comprises a channel region of an n-type transistor.

5. The semiconductor device of claim 4, wherein the thickness of the gate electrode in the first portion of the gate electrode structure is less than the thickness of the gate electrode in the second portion of the gate electrode structure.

6. The semiconductor device of claim 1, further comprising a gate insulating film traversing the first active region, the second active region, and the field insulating film between the substrate and the gate electrode structure,
wherein the gate electrode structure further comprise a conductive film disposed on the gate insulating film and an etch prevention film disposed on the conductive film, and
wherein the gate electrode is disposed on the etch prevention film.

7. The semiconductor device of claim 6, wherein the gate electrode structure further comprises a work function adjustment film disposed between the etch prevention film and the gate electrode, and
wherein the second portion of the gate electrode structure excludes the work function adjustment film.

8. The semiconductor device of claim 7, wherein a thickness of the work function adjustment film in the third portion of the gate electrode structure is greater than a thickness of the work function adjustment film in the first portion of the gate electrode structure.

9. The semiconductor device of claim 6, wherein the gate electrode structure further comprises a work function adjustment film disposed between the etch prevention film and the gate electrode, and
wherein a thickness of the work function adjustment film in the third portion of the gate electrode structure is greater than a thickness of the work function adjustment film in the first portion of the gate electrode structure, and
wherein the thickness of the work function adjustment film in the third portion of the gate electrode structure is greater than a thickness of the work function adjustment film in the second portion of the gate electrode structure.

10. The semiconductor device of claim 9, wherein the thickness of the work function adjustment film in the first portion of the gate electrode structure is different from the thickness of the work function adjustment in the second portion of the gate electrode structure.

11. The semiconductor device of claim 1, further comprising a gate insulating film traversing the first active region, the second active region, and the field insulating film between the substrate and the gate electrode structure,
wherein the gate electrode structure further comprises a work function adjustment contacting the gate insulating film on the gate insulating film, and
wherein the gate electrode is disposed on the work function adjustment film.

12. The semiconductor device of claim 11, wherein a thickness of the work function adjustment film in the third portion of the gate electrode structure is greater than a thickness of the work function adjustment film in the first portion of the gate electrode structure, and
wherein the thickness of the work function adjustment film in the third portion of the gate electrode structure is greater than a thickness of the work function adjustment film in the second portion of the gate electrode structure.

13. The semiconductor device of claim 1, wherein a distance between the first active region and the third portion of the gate electrode structure is different from a distance between the second active region and the third portion of the gate electrode structure.

* * * * *